US008885344B2

(12) United States Patent
Asakura et al.

(10) Patent No.: US 8,885,344 B2
(45) Date of Patent: Nov. 11, 2014

(54) SEMICONDUCTOR DEVICE

(75) Inventors: Hideki Asakura, Kariya (JP); Daijiro Noda, Kariya (JP); Kazuo Kayano, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 249 days.

(21) Appl. No.: 13/402,250

(22) Filed: Feb. 22, 2012

(65) Prior Publication Data
US 2012/0218716 A1    Aug. 30, 2012

(30) Foreign Application Priority Data

Feb. 28, 2011   (JP) .................................. 2011-043149
Nov. 28, 2011   (JP) .................................. 2011-259486

(51) Int. Cl.
| H05K 7/20 | (2006.01) |
| H01L 23/40 | (2006.01) |
| H01L 23/34 | (2006.01) |
| H01L 25/16 | (2006.01) |
| H01L 25/18 | (2006.01) |

(52) U.S. Cl.
CPC ............ H01L 23/4006 (2013.01); H05K 7/209 (2013.01); H01L 23/4012 (2013.01); H01L 2023/4081 (2013.01); H01L 25/165 (2013.01); H01L 25/18 (2013.01)
USPC .......... 361/715; 361/719; 361/141; 165/80.2; 257/719; 248/222.14

(58) Field of Classification Search
CPC .... H05K 7/2089–7/20945; H01L 23/40–23/42

USPC ........................ 361/688–723; 165/80.2, 185; 257/718–719; 174/547–548, 16.3; 363/141
See application file for complete search history.

(56) References Cited

U.S. PATENT DOCUMENTS

| 6,297,549 | B1 * | 10/2001 | Hiyoshi ......................... 257/703 |
| 6,943,443 | B2 * | 9/2005 | Nobori et al. .................. 257/704 |
| 2003/0067748 | A1 | 4/2003 | Tamba et al. |
| 2005/0128713 | A1 | 6/2005 | Schmidberger |
| 2008/0278918 | A1 | 11/2008 | Tominaga et al. |
| 2009/0039504 | A1 * | 2/2009 | Kimura et al. ................ 257/718 |
| 2009/0168358 | A1 | 7/2009 | Koike et al. |
| 2010/0254093 | A1 * | 10/2010 | Oota et al. ..................... 361/720 |
| 2010/0259898 | A1 * | 10/2010 | Kimura et al. ................ 361/704 |
| 2011/0216507 | A1 * | 9/2011 | Kadomoto et al. ........... 361/714 |

FOREIGN PATENT DOCUMENTS

| JP | 62-092651 | 6/1987 |
| JP | 02-039556 | 2/1990 |
| JP | 2001-144249 | 5/2001 |
| JP | 2002-034268 | 1/2002 |
| JP | 2007-329167 | 12/2007 |
| JP | 2007-335735 | 12/2007 |
| JP | 2008-273476 | 11/2008 |
| JP | 2009-094257 | 4/2009 |
| JP | 2009-254189 | 10/2009 |
| JP | 2010-283014 | 12/2010 |

* cited by examiner

Primary Examiner — Zachary M Pape
(74) Attorney, Agent, or Firm — Baker & Hostetler LLP

(57) ABSTRACT

A terminal board is electrically connected to a module terminal of a semiconductor module. The semiconductor module and a cooling unit are laminated on the terminal board. A spring member is disposed on the semiconductor module and the cooling unit. A spring support tool is disposed on the spring member in order to apply, to the spring member, an urging force for pressing the semiconductor module and the cooling unit against the terminal board.

9 Claims, 18 Drawing Sheets

A-A Cross-Section

A-A Cross-Section

A-A Cross-Section

A-A Cross-Section

A-A Cross-Section

A-A Cross-Section

A-A Cross-Section

A-A Cross-Section

SEMICONDUCTOR DEVICE

CROSS REFERENCE TO RELATED APPLICATION

This application claims priority to Japanese Patent Application No. 2011-043149 filed Feb. 28, 2011 and Japanese Patent Application No. 2011-259486 filed Nov. 28, 2011.

BACKGROUND

The present invention relates to a semiconductor device.

A pressing flat spring and a reinforcing beam disclosed in Japanese Laid-Open Patent Publication No. 2007-329167 fix a semiconductor module in a pressing state against a heat sink or a radiator plate. In detail, the semiconductor module is disposed on the heat sink or the radiator plate. The pressing flat spring is disposed on the semiconductor module. The reinforcing beam for reinforcing the pressing flat spring is disposed on the pressing flat spring. A plurality of screw through holes are formed on the semiconductor module. Screws passing through the screw through holes fix the reinforcing beam to the heat sink or the radiator plate. Due to the fastening of the screws, the pressing flat spring urges the semiconductor module toward the heat sink or the radiator plate.

With the structure described above, dedicated screws are required for fixing the semiconductor module to the heat sink or the radiator plate. Furthermore, it is necessary to provide the screw through holes on the semiconductor module.

It is an objective of the present invention to provide a semiconductor device capable of easily fixing a semiconductor module and a cooling unit to the semiconductor device.

SUMMARY

In accordance with one aspect of the present disclosure, a semiconductor device is provided that includes a semiconductor module having a module terminal, a cooling unit configured to cool the semiconductor module, a terminal board configured to be electrically connected to the module terminal. The semiconductor module and the cooling unit are laminated on the terminal board. The semiconductor device also includes a spring member disposed on the semiconductor module and the cooling unit, and a spring support tool. The spring member is configured to press the semiconductor module and the cooling unit against the terminal board. The spring support tool is disposed on the spring member in order to support the spring member. The spring support tool applies, to the spring member, an urging force for pressing the semiconductor module and the cooling unit against the terminal board.

According to the structure, the semiconductor module and cooling unit are laminated and disposed on the terminal board. The spring member is disposed on the semiconductor module and the cooling unit. The semiconductor module and the cooling unit are pressed against the terminal board by means of the spring member. The spring support tool disposed on the spring member applies to the spring member urging force for pressing the semiconductor module and the cooling unit against the terminal board. As a result, the semiconductor module and the cooling unit are easily fixed to the semiconductor device.

In accordance with one aspect, the semiconductor device further includes a control board configured to control the semiconductor module. The control board is fixed onto the spring support tool. According to the structure, no dedicated member for fixing the control board is necessary.

In accordance with one aspect, the spring support tool is configured to function as an electromagnetic noise shielding member positioned between the semiconductor module and the control board.

According to this structure, even if electromagnetic noise is generated in the semiconductor module, the spring support tool functions as an electromagnetic noise shielding member. Therefore, the control board is not easily influenced by electromagnetic noise.

In accordance with one aspect, the cooling unit is disposed on the terminal board, and the semiconductor module is disposed on the cooling unit. The semiconductor device further includes a capacitor embedded in the terminal board.

According to the structure, the cooling unit can cool the capacitor buried in the terminal board.

In accordance with one aspect, the cooling unit is a lower cooling unit provided under the semiconductor module. The semiconductor device further includes an upper cooling unit provided on the semiconductor module.

According to the structure, it is possible to further cool the semiconductor module.

In accordance with one aspect, the module terminal is configured to be positioned on the terminal board through fitting based on a projection-recess relationship.

According to the structure, the module terminal can easily be positioned on the terminal board.

In accordance with one aspect, the terminal board is formed of plastic, and the terminal board has a terminal portion to be electrically connected to the module terminal.

In accordance with one aspect, the module terminal has a plurality of power terminals, and the semiconductor module further includes a plurality of control signal terminals. Of a first side and a second side, which interpose the semiconductor module therebetween, the power terminals are collectively disposed on the first side, and the control signal terminals are collectively disposed on the second side. According to the structure, it is possible to simplify the configuration for wire routing. As a result, it is possible to implement a reduction in size without generating wasteful space in the semiconductor device.

In accordance with one aspect, the cooling unit has a cooling opposed surface, with the cooling opposed surface facing the semiconductor module. The spring support tool has a support opposed surface, with the support opposed surface facing the semiconductor module. The semiconductor module defines a mounting region necessary for mounting the semiconductor module on the semiconductor device. The dimension of the cooling opposed surface and the dimension of the support opposed surface are set based on the dimension of the mounting region. According to the structure, it is possible to implement a reduction in size without generating wasteful space in the semiconductor device.

In accordance with one aspect, the terminal board has a mounting portion for mounting the cooling unit on the mounting portion. The terminal board further has a fixing portion configured to fix the spring support tool. According to the structure, the terminal board can fulfill both the function of a component for mounting the cooling unit thereon and the function of a component for fixing the spring support tool. As compared with a case in which the fixing portion of the spring support tool is provided separately in another component, the structure described above reduces the size without generating wasteful space in the semiconductor device.

DETAILED DESCRIPTION OF ILLUSTRATIVE EMBODIMENTS

FIGS. 1 to 7 illustrate a semiconductor device 10 according to a first embodiment of the present invention.

Figure 2:
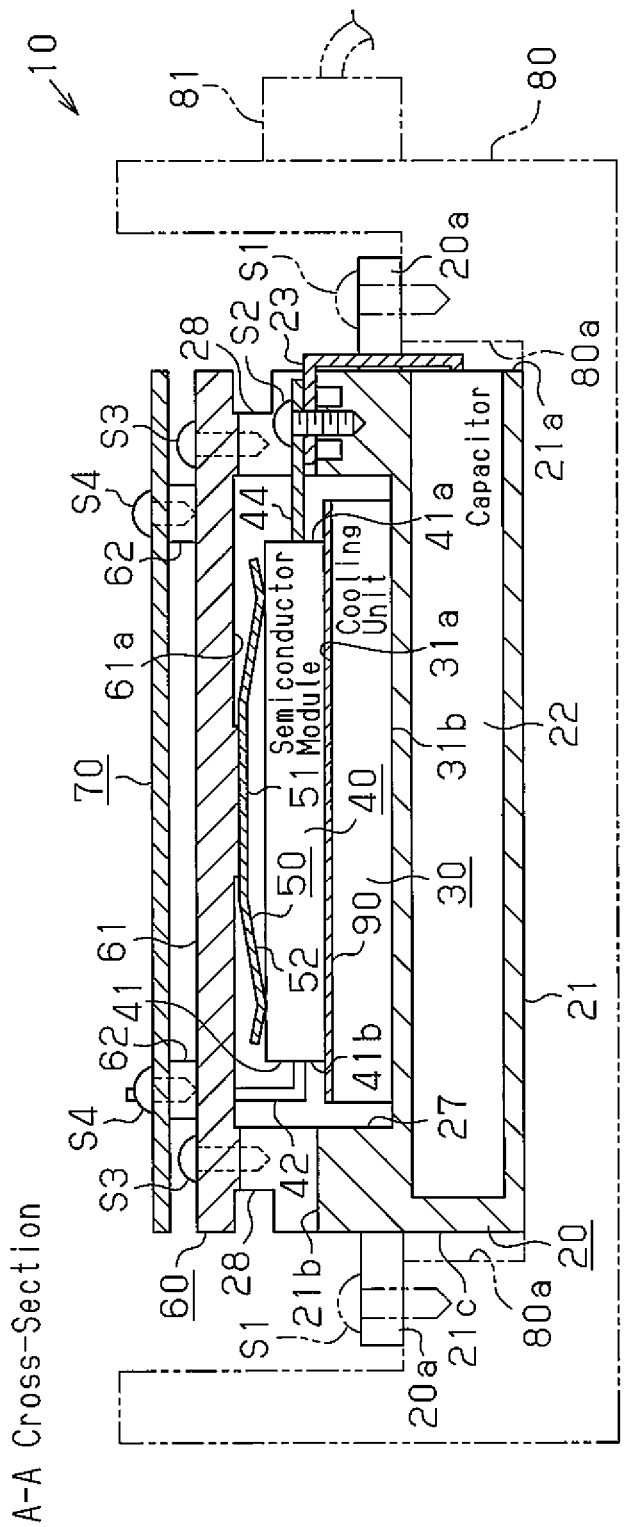
FIG. 2 is a cross-sectional view taken along line A-A of FIG. 1.

As shown in FIG. 2, the semiconductor device 10 according to the present embodiment includes a terminal board 20 accommodated in a housing 80, a cooling unit 30 accommodated in the terminal board 20, and a plurality of, for example, three semiconductor modules 40 (only one of them is shown in FIG. 2) disposed on the cooling unit 30. Furthermore, the semiconductor device 10 includes a flat spring 50 serving as a spring member disposed on the semiconductor module 40, a bracket 60 serving as a spring support tool disposed on the flat spring 50, and a control circuit board 70 serving as a control board disposed on the bracket 60.

The terminal board 20 is disposed in the housing 80 formed of aluminum. The terminal board 20 is fixed to the housing 80 by means of board fixing screws S1. In detail, the housing 80 has a shape corresponding to a box having an open upper surface, and the terminal board 20 is mounted on the bottom surface in an inner part of the housing 80. The board fixing screws S1 penetrate attaching arms 20a extending from the terminal board 20 and are thus fixed into terminal board attaching portions 80a of the housing 80. Accordingly, the terminal board 20 is attached to the housing 80.

The terminal board 20 is a terminal board having capacitors that includes an insulating base 21 formed of plastic and a plurality of capacitors 22 (only one of them is shown in the drawing). The capacitors 22 are buried in the insulating base 21 through molding. In other words, the insulating base 21 and the capacitors 22 are integrated with each other. The capacitors 22 are exposed at a first long side surface 21a (a right side surface in FIG. 2), which is a side surface of the insulating base 21. The first long side surface 21a and a second long side surface 21c correspond to a long side of the insulating base 21 having a rectangular shape seen on a plane, respectively. In other words, the second long side surface 21c is placed on an opposite side to the first long side surface 21a, and is a left side surface in FIG. 2. The first long side surface 21a is a first side, for example, in the first side and a second side, which interpose the semiconductor module 40 therebetween, and the second long side surface 21c is the second side.

As shown in FIG. 2, an accommodating recess 27 is formed on an upper surface 21b of the insulating base 21, and the cooling unit 30 is mounted on a bottom surface of the accommodating recess 27. In other words, the bottom surface of the accommodating recess 27 serves as a mounting portion in which the terminal board 20 mounts the cooling unit 30 thereon. Heat generated in the capacitors 22 is dissipated to the cooling unit 30 via the insulating base 21 of the terminal board 20.

The semiconductor module 40 is mounted on the cooling unit 30 through silicone grease 90. Heat generated in the semiconductor module 40 is dissipated to the cooling unit 30 via the silicone grease 90. The cooling unit 30 is a lower cooling unit provided under the semiconductor module 40.

Figure 3:
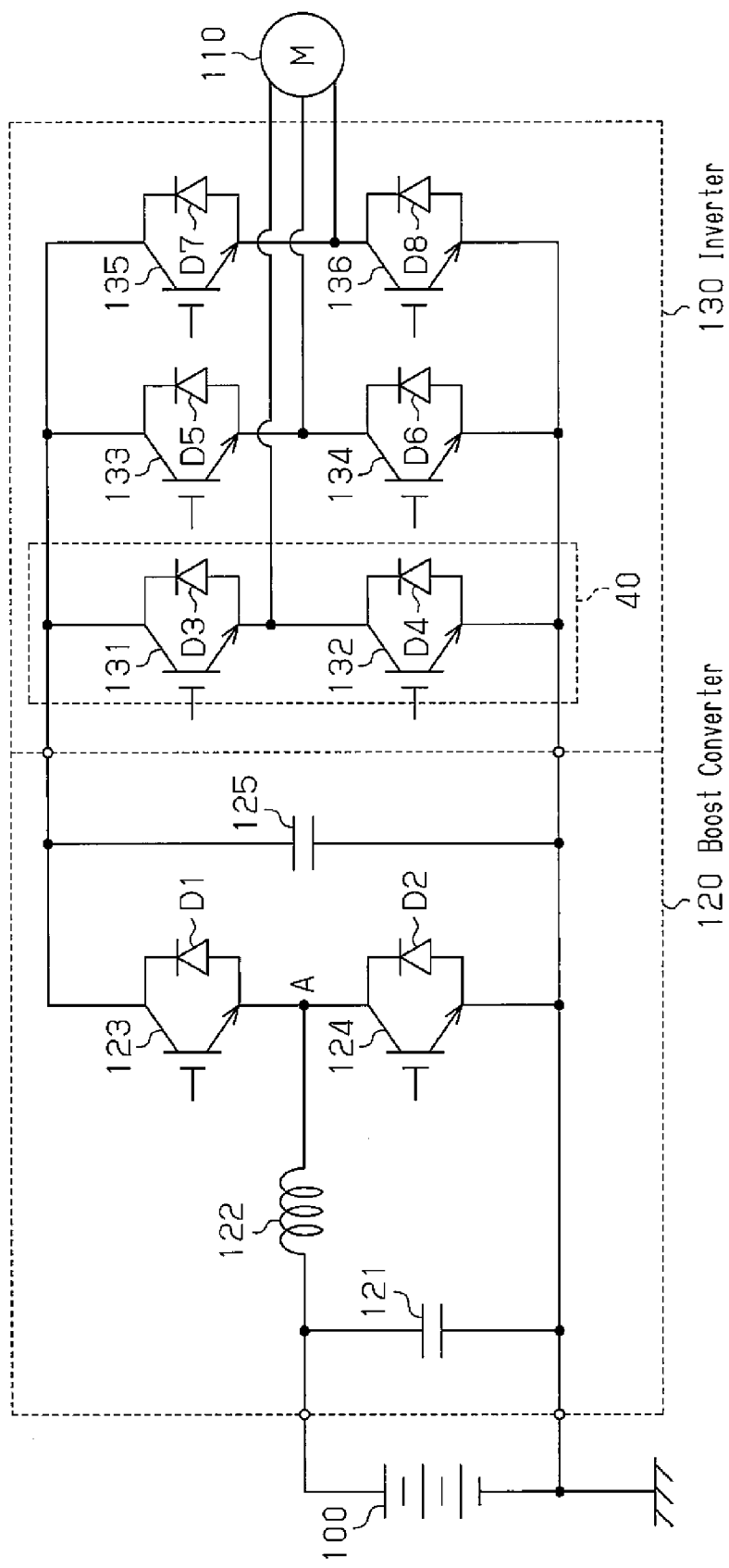
FIG. 3 is a diagram showing an electrical structure of a traveling motor driving system for a hybrid vehicle, which is configured to have the semiconductor module and the capacitor illustrated in FIG. 2.

The three semiconductor modules 40 according to the present embodiment are power semiconductor modules forming three-phase upper and lower arms of an inverter 130 in FIG. 3. In other words, one of the semiconductor modules 40 forms one phase of a three-phase inverter.

FIG. 3 illustrates electrical structure for the semiconductor device according to the present embodiment.

As shown in FIG. 3, the semiconductor device 10 forms a traveling motor driving device for a hybrid vehicle. The hybrid vehicle has a battery 100, a traveling motor 110, the inverter 130 for driving the traveling motor 110, and a boost converter 120 provided between the battery 100 and the inverter 130. The boost converter 120 includes a low-voltage capacitor 121, a reactor 122, a transistor 123 for an upper arm, a diode D1, a transistor 124 for a lower arm, a diode D2, and a high-voltage capacitor 125. The capacitors 22 of the terminal board 20 form the high-voltage capacitor 125 in FIG. 3. The transistors 123 and 124 are IGBTs and a gate voltage is regulated to carry out ON/OFF control.

The transistors 123 and 124 are connected in series between a power line and a ground line in the inverter 130. The collector of the transistor 123 is connected to the power line, and the emitter of the transistor 123 is connected to the collector of the transistor 124. The emitter of the transistor 124 is connected to the ground line and the negative electrode of the battery 100. A node A of the emitter of the transistor 123 and the collector of the transistor 124 is connected to one of the terminals of the reactor 122. The other terminal of the reactor 122 is connected to the positive electrode of the battery 100. Diodes D1 and D2 are connected between the collector and the emitter in the transistors 123 and 124 in order to cause a current to flow from the emitter side to the collector side, respectively.

As shown in FIG. 3, the low-voltage capacitor 121 is connected to an input terminal of the boost converter 120, that is, a connecting terminal of the boost converter 120 to the battery 100. The high-voltage capacitor 125 is connected to an output terminal of the boost converter 120, that is, a connecting terminal of the boost converter 120 to the inverter 130, in detail, between the power line and the ground line in the inverter 130. In other words, the high-voltage capacitor 125 is connected in parallel with the transistor 123 for an upper arm and the transistor 124 for a lower arm, which are connected in series to each other.

The inverter 130 converts a DC power supplied from the boost converter 120 to an AC power and supplies the AC power to the traveling motor 110 serving as a load. Consequently, the traveling motor 110 is rotated and driven. In detail, the inverter 130 is configured by respective arms having U, V and W phases, which are disposed in parallel with each other between the power line and the ground line. Each of the arms is configured by a series connection of two transistors (IGBTs) 131 and 132, is configured by a series connection of transistors 133 and 134, or is configured by a series connection of transistors 135 and 136. Diodes D3, D4, D5, D6, D7 and D8 for causing a current to flow from the emitter side to the collector side are disposed between the collectors and the emitters in the transistors 131, 132, 133, 134, 135 and 136, which form the arms, respectively.

Figure 1:
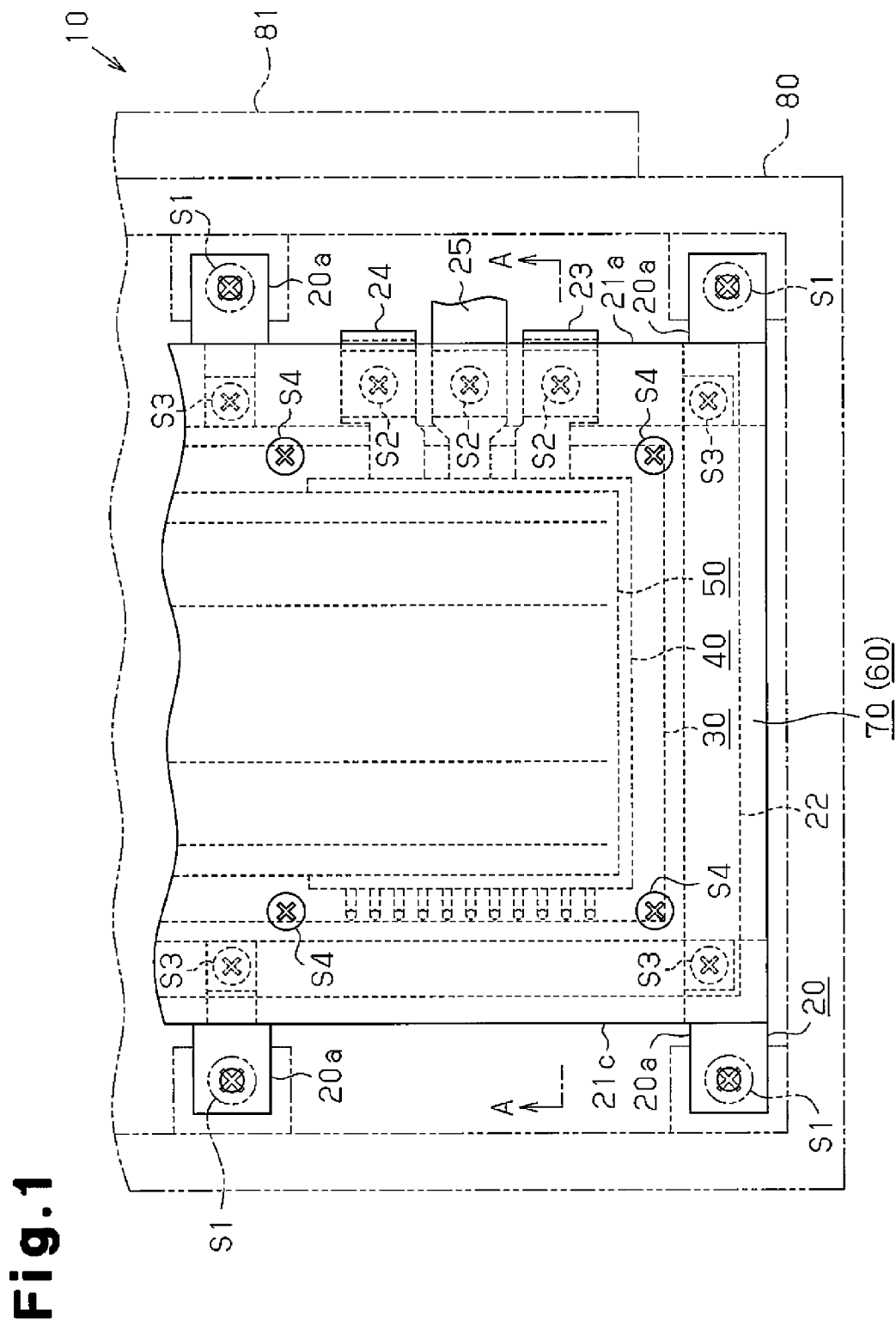
FIG. 1 is a plan view showing a semiconductor device according to a first embodiment.
Figure 4A:
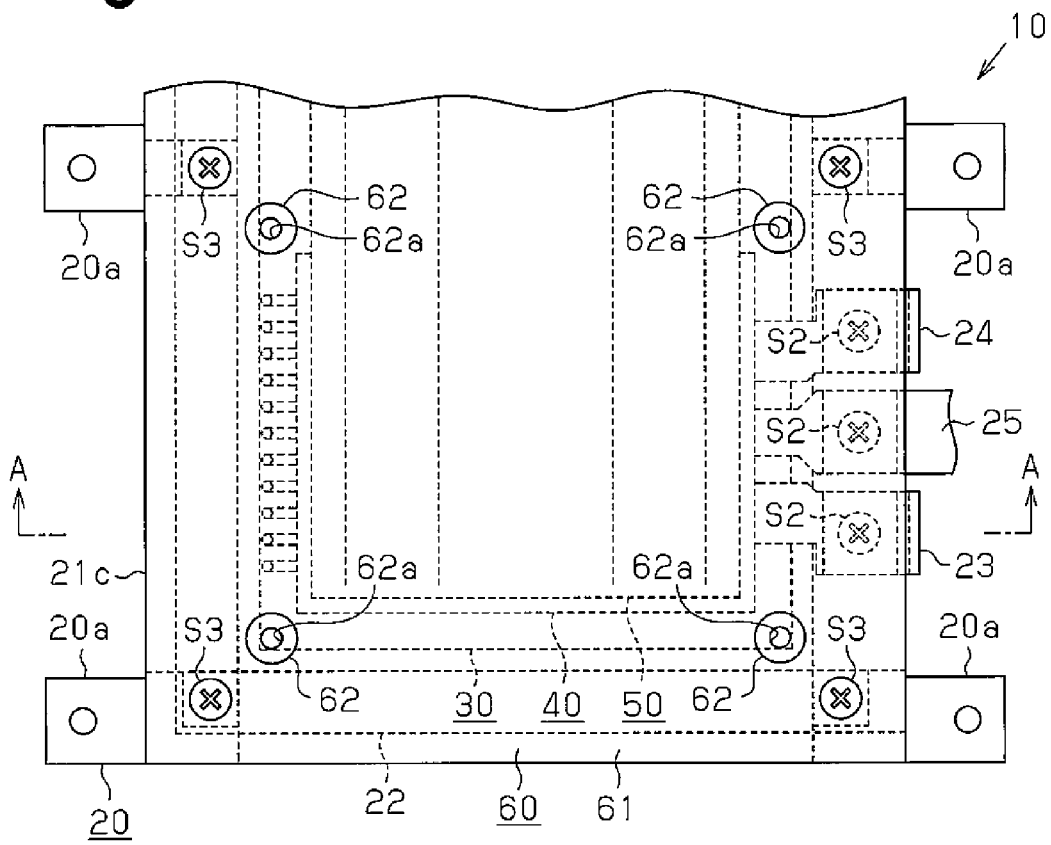
FIG. 4(a) is an explanatory plan view for illustrating the component configuration in the semiconductor device.
Figure 4B:
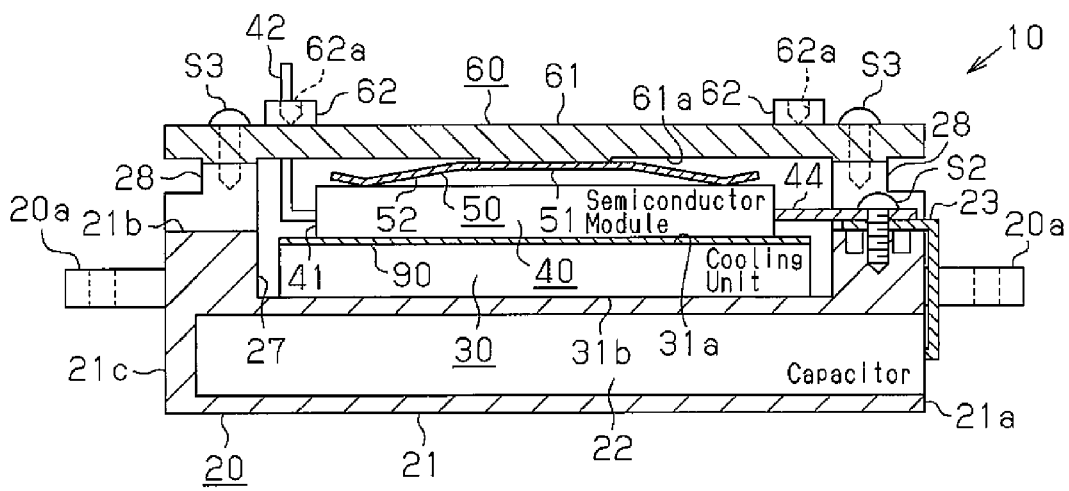
FIG. 4(b) is a longitudinal cross-sectional view taken along line A-A of FIG. 4(a)
Figure 5A:
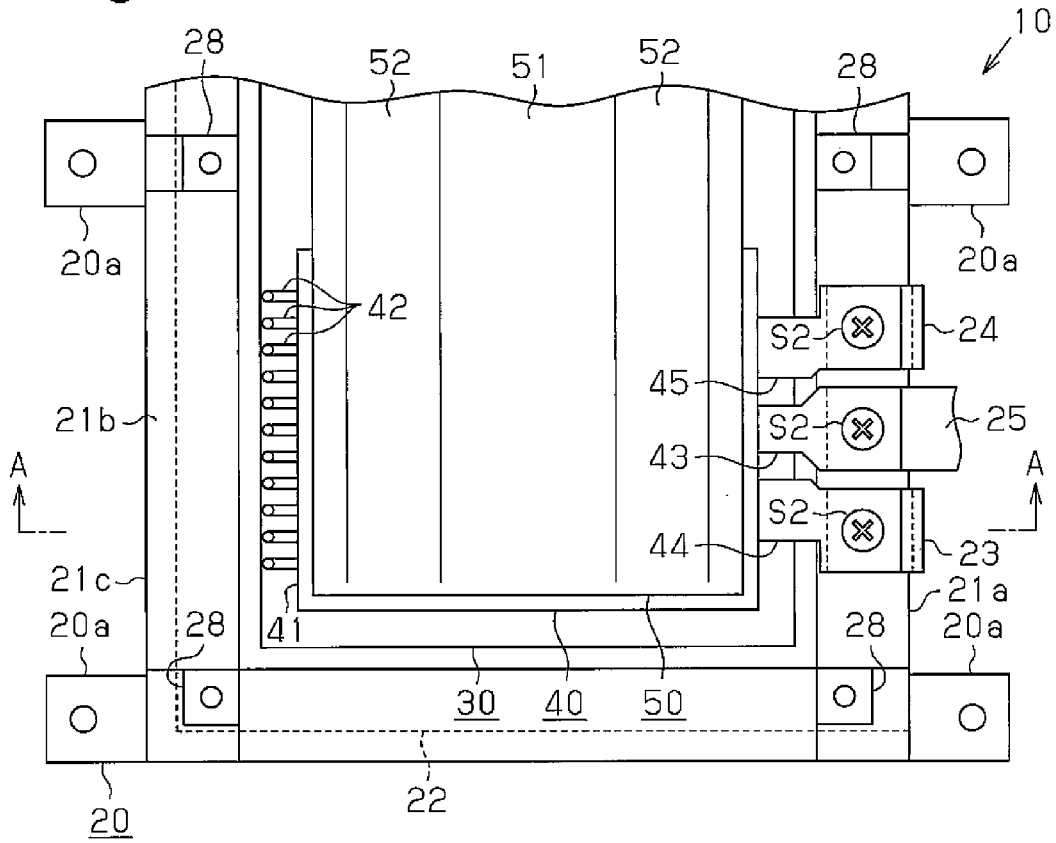
FIG. 5(a) is an explanatory plan view for illustrating the component configuration in the semiconductor device.
Figure 5B:
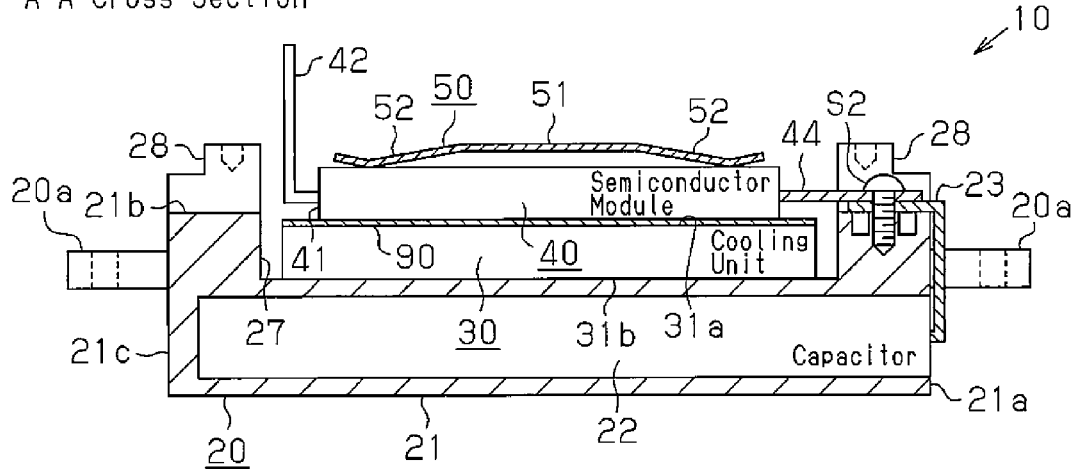
FIG. 5(b) is a longitudinal cross-sectional view taken along line A-A of FIG. 5(a)
Figure 6A:
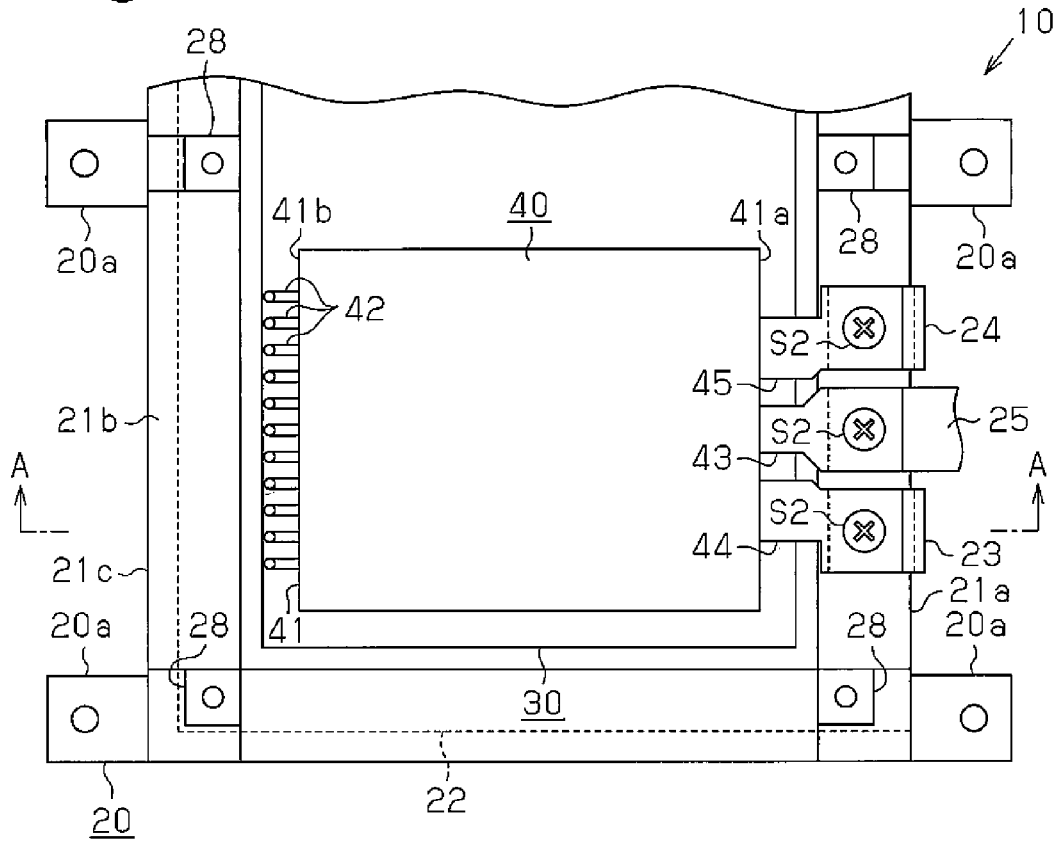
FIG. 6(a) is an explanatory plan view for illustrating the component configuration in the semiconductor device.
Figure 6B:
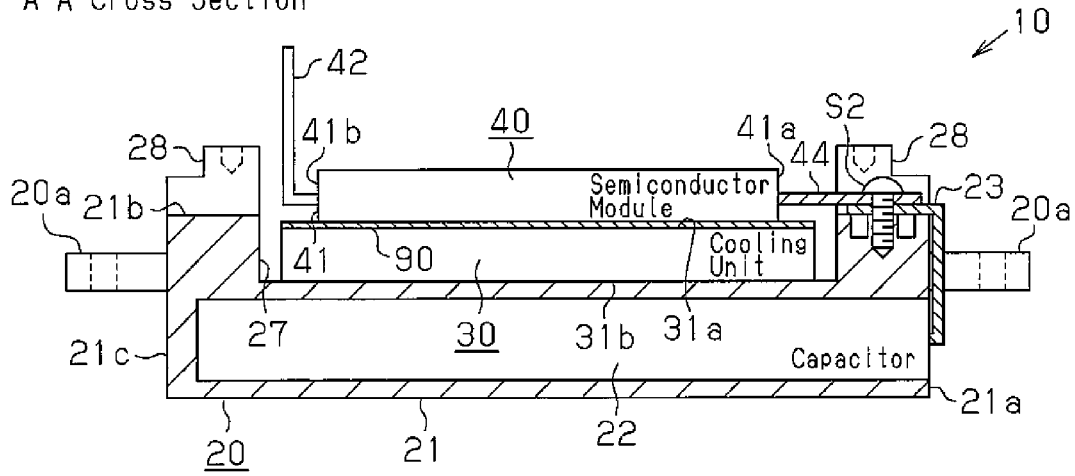
FIG. 6(b) is a longitudinal cross-sectional view taken along line A-A of FIG. 6(a)
Figure 7A:
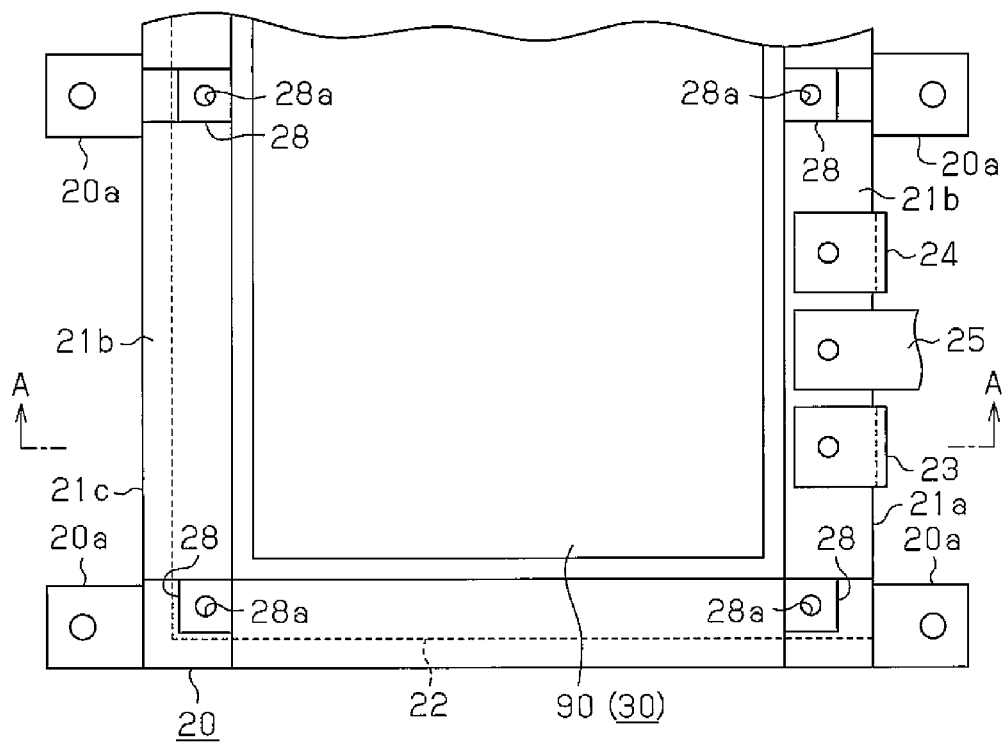
FIG. 7(a) is an explanatory plan view for illustrating the component configuration in the semiconductor device.
Figure 7B:
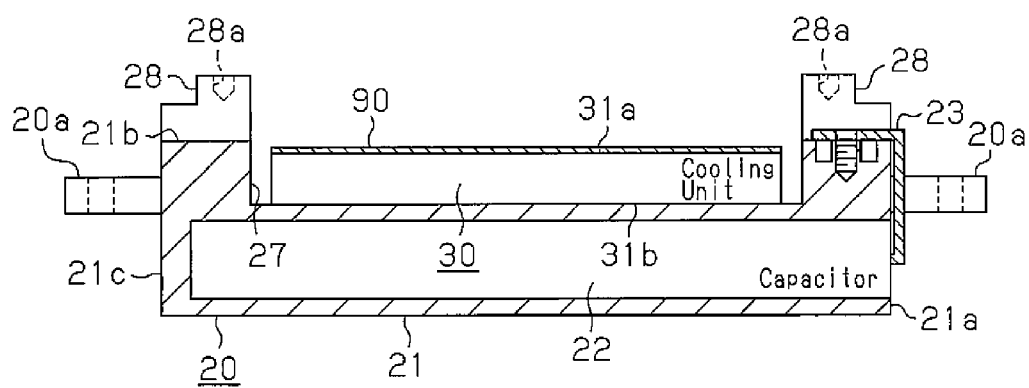
FIG. 7(b) is a longitudinal cross-sectional view taken along line A-A of FIG. 7(a)

FIGS. 4(a) and 4(b) show a state in which the control circuit board 70 is removed from the semiconductor device 10 in FIGS. 1 and 2. FIGS. 5(a) and 5(b) show a state in which the bracket 60 is removed from FIGS. 4(a) and 4(b). FIGS. 6(a) and 6(b) show a state in which the flat spring 50 is removed from FIGS. 5(a) and 5(b). FIGS. 7(a) and 7(b) show a state in which the semiconductor module 40 is removed from FIGS. 6(a) and 6(b).

As shown in FIG. 7(b), the terminal board 20 is used for fixing the cooling unit 30 and for fastening the semiconductor module 40 to the power terminal A plurality of bracket attaching portions 28 are erected on the upper surface 21b of the insulating base 21 in the terminal board 20. The bracket attaching portions 28 are fixing portions configured to fix the bracket 60 to the terminal board 20. A screw hole 28a is provided on an upper surface of each of the bracket attaching portions 28.

As shown in FIG. 7(a), each capacitor 22 has a positive electrode terminal 23 and a negative electrode terminal 24. The positive electrode terminal 23 and the negative electrode terminal 24 each have a shape corresponding to a band plate. The positive electrode terminal 23 and the negative electrode terminal 24 are extend along the first long side surface 21a of the insulating base 21 in an upward direction and are bent by 90 degrees, and thereafter extend in a horizontal direction along the upper surface 21b of the insulating base 21.

As shown in FIG. 7(a), a base output terminal 25 serving as a connecting terminal is arranged on the upper surface 21b of the insulating base 21 between the positive electrode terminal 23 and the negative electrode terminal 24. The base output terminal 25 has a shape corresponding to a band plate. The base output terminal 25 extends toward a connector 81 (see FIG. 1) provided on the housing 80. The base output terminal 25 is used for electrically connecting the semiconductor module 40 to the connector 81. The positive electrode terminal 23, the negative electrode terminal 24 and the base output terminal 25 are terminal portions, which are collected into the first long side surface 21a of the terminal board 20.

The cooling unit 30 has a shape of a thin box and is of a water cooling type for carrying out cooling by passage of cooling water through an inner part. A lower surface of the cooling unit 30 is disposed in an abutting state on the bottom surface of the accommodating recess 27 in the terminal board 20. An upper surface 31a of the cooling unit 30 is a cooling opposed surface as an opposed surface to the semiconductor module 40.

As shown in FIG. 6, a plurality of semiconductor modules 40 (only one of them is shown in the drawing) are mounted on the cooling unit 30 through the silicone grease 90. One of three semiconductor modules 40 forming three phases includes the transistors 131 and 132 and the diodes D3 and D4 in FIG. 3. In other words, in the semiconductor module 40, the transistors 131 and 132 and the diodes D3 and D4, which serve as semiconductor elements, are sealed with resin.

The second semiconductor module 40 includes the transistors 133 and 134 and the diodes D5 and D6, and the third semiconductor module 40 includes the transistors 135 and 136 and the diodes D7 and D8. These semiconductor modules 40 are mutually configured in the same manner and are arranged on the cooling unit 30.

As shown in FIG. 6(a), a module body 41 to be a body portion of the semiconductor module 40 has a shape corresponding to a thin box, and a plurality of semiconductor elements are sealed with resin. The module body 41 has a first surface 41a facing in the direction of the first longer side surface 21a and a second surface 41b facing in the direction of the second longer side surface 21c. A module output terminal 43, a power line terminal 44 and a grounding line terminal 45 are extend from the first surface 41a of the module body 41. The terminals 43 to 45 serving as the power terminals each have a shape corresponding to a plate and extend horizontally. The module output terminal 43, the power line terminal 44 and the grounding line terminal 45 are overlaid on a base output terminal 25, and the positive electrode terminal 23 and the negative electrode terminal 24 in the capacitor 22, which extend from the terminal board 20. A plurality of control signal terminals 42, each of which is formed by a pin, extend from the second surface 41b of the module body 41. The control signal terminals 42 are bent upward and extended. The module output terminal 43, the power line terminal 44 and the grounding line terminal 45 are collected into the first long side surface 21a of the terminal board 20. On the other hand, all of the control signal terminals 42 are collected into the second long side surface 21c of the terminal board 20.

The positive electrode terminal 23 of the capacitor 22 is disposed in an overlap under the power line terminal 44 of the semiconductor module 40. The negative electrode terminal 24 of the capacitor 22 is disposed in an overlap under the ground line terminal 45 of the semiconductor module 40. The base output terminal 25 is disposed in an overlap under the module output terminal 43. Screw through hole for inserting terminal connecting screws S2 are formed on the terminals 23 to 25 and the terminals 43 to 45. When the terminal connecting screws S2 pass each screw through holes of the terminals 23 to 25 and 43 to 45 and are fixed into the terminal board 20, the semiconductor module 40 is fastened to the terminal board 20. The terminal connecting screws S2 are fastened so that the power line terminal 44 of the semiconductor module 40 and the positive electrode terminal 23 of the capacitor 22 are electrically connected to each other. Similarly, the ground line terminal 45 of the semiconductor module 40 and the negative electrode terminal 24 of the capacitor 22 are electrically connected to each other. The module output terminal 43 and the base output terminal 25 are electrically connected to each other. The base output terminal 25 is connected to an external apparatus, for example, the traveling motor 110 through the connector 81. Thus, the terminal board 20 can be electrically connected to the terminals 43 to 45 of the semiconductor module 40.

As shown in FIG. 5, the flat spring 50 is mounted on the semiconductor module 40. The flat spring 50 is a spring member formed by a spring steel plate. The flat spring 50 has a spring center portion 51 extends horizontally along the first long side surface 21a, a spring bent portion 52 extends from the spring center portion 51 toward the first long side surface 21a, and a spring bent portion 52 extend toward the second long side surface 21c. The spring bent portion 52 serving as both side portions in the flat spring 50 is bent obliquely and downward.

As shown in FIG. 4, the bracket 60 is disposed on the flat spring 50. The bracket 60 is formed by a metallic plate material such as aluminum.

A bracket body 61 serving as a body portion of the bracket 60 has a shape of a rectangular plate. A plurality of board attaching columns 62 serving as column portions for attaching the control circuit board 70 are formed on an upper surface of the bracket body 61. A screw hole 62a is provided on an upper surface of each of the board attaching columns 62. A lower surface 61a of the bracket body 61 is a support opposed surface to be an opposed surface to the semiconductor module 40.

The bracket 60 is mounted on the bracket attaching portion 28 of the terminal board 20. Bracket fixing screws S3 penetrate the bracket 60 and are thus fixed into the bracket attaching portions 28 of the terminal board 20 so that the bracket 60 is fixed to the terminal board 20. In other words, the bracket fixing screws S3 fix the bracket 60 to the terminal board 20.

In fastening the bracket fixing screws S3, the flat spring 50 is pressed by the bracket 60 from above and is thus deformed. In other words, the semiconductor module 40 and the cooling unit 30 are pressed downward by a downward urging force generated in the flat spring 50.

Thus, the semiconductor module 40 and the cooling unit 30 are interposed between the bracket 60 or the flat spring 50 and the terminal board 20. In other words, the flat spring 50 presses the semiconductor module 40 and the cooling unit 30 and fixes them to the terminal board 20. Accordingly, a special fixing screw for fixing the module body 41 of the semiconductor module 40 to the terminal board 20 is not required. Similarly, a special fixing screw for fixing the cooling unit 30 to the terminal board 20 is not required.

The cooling unit 30 cools both the semiconductor module 40 and the capacitor 22. The capacitor 22, the cooling unit 30 and the semiconductor module 40 are supported in a laminated state with each other. Therefore, wiring between the capacitor 22 and the semiconductor module 40 is shortened so that inductance is reduced.

As shown in FIGS. 1 and 2, the control circuit board 70 having a rectangular shape is mounted on the board attaching column 62 of the bracket 60. Board fixing screws S4 for fixing a board penetrate the control circuit board 70 and are thus fixed into the board attaching columns 62 of the bracket 60 so that the control circuit board 70 is fixed.

The control circuit board 70 is electrically connected to the semiconductor module 40 with the control signal terminal (pin) 42 of the semiconductor module 40. A control device for driving the transistors 131 and 132 and the like of the semiconductor module 40, that is, an IC is mounted on the control circuit board 70. The bracket 60 is set to have a ground potential, that is, is grounded and thus functions as an electromagnetic noise shielding plate between the semiconductor module 40 and the control circuit board 70. In the semiconductor module 40, even if radiated electromagnetic noise is caused by a switching operation of the transistors 131 and 132 or the like, the bracket 60 functions as an electromagnetic noise shielding member. Accordingly, it is possible to reduce adverse influence from the radiated electromagnetic noise on the control circuit board 70.

Next, description will be given of a method for assembling the semiconductor device 10 having such a structure.

First, as shown in FIGS. 7(a) and 7(b), the cooling unit 30 is mounted on the bottom surface of the accommodating recess 27 of the terminal board 20. The silicone grease 90 is applied onto the upper surface of the cooling unit 30. The silicone grease 90 may be applied to the back surface of the individual semiconductor module 40 in place of the upper surface of the cooling unit 30.

As shown in FIGS. 6(a) and 6(b), the semiconductor module 40 is mounted on the cooling unit 30 through the silicone grease 90. The terminals 23 to 25 of the terminal board 20 are fixed to the terminals 43 to 45 of the semiconductor module 40 with the terminal connecting screws S2. In other words, the power line terminal 44 of the semiconductor module 40 and the positive electrode terminal 23 of the capacitor 22 are electrically connected to each other. Moreover, the ground line terminal 45 of the semiconductor module 40 and the negative electrode terminal 24 of the capacitor 22 are electrically connected to each other. Furthermore, the module output terminal 43 and the base output terminal 25 are electrically connected to each other.

As shown in FIGS. 5(a) and 5(b), subsequently, the flat spring 50 is mounted on the semiconductor module 40.

As shown in FIGS. 4(a) and 4(b), the bracket 60 is mounted on the terminal board 20 from above the flat spring 50 and is fastened and fixed with the bracket fixing screws S3. The urging force of the flat spring 50 which is generated by fastening the bracket fixing screws S3 urges the semiconductor module 40 and the cooling unit 30. Accordingly, it is possible to regulate inadvertent movement of the semiconductor module 40 and the cooling unit 30 with respect to the terminal board 20.

As shown in FIGS. 1 and 2, the control circuit board 70 is mounted on the bracket 60 and is fastened and fixed with the board fixing screws S4.

The fixation of the terminals 23 to 25 and 43 to 45 may be executed after fixation of the bracket 60.

Thus, the bracket 60 presses the flat spring 50. The flat spring 50 presses the semiconductor module 40 positioned under the flat spring 50 and the cooling unit 30 positioned under the semiconductor module 40 toward the terminal board 20 at the same time and thus fixes them.

According to the embodiment, it is possible to obtain the following advantages.

(1) The semiconductor device 10 includes the semiconductor module 40, the cooling unit 30 for cooling the semiconductor module 40, and the terminal board 20 to be electrically connected to the terminal of the semiconductor module 40. Furthermore, the semiconductor device 10 includes the flat spring 50 serving as the spring member and the bracket 60 serving as the spring member support tool. The flat spring 50 is disposed on the semiconductor module 40 and the cooling unit 30, which are laminated on the terminal board 20. The flat spring 50 presses the semiconductor module 40 and the cooling unit 30 against the terminal board 20. The bracket 60 is disposed on the flat spring 50 and is fixed to the terminal board 20. Accordingly, the bracket 60 applies, to the flat spring 50, urging force for pressing the semiconductor module 40 and the cooling unit 30 against the terminal board 20.

For example, in the structure disclosed in Japanese Laid-Open Patent Publication No. 2007-329167, the special screw for fixing the heat sink or the radiator plate is required because the pressing flat spring and the reinforcing beam press the semiconductor module against the heat sink or the radiator plate and fix them. Moreover, there is a restriction into a structure in which the screw through hole is provided on the central part of the semiconductor module. On the other hand, in the present embodiment, the special screw for fixing the cooling unit 30 is not required. Moreover, it is not necessary to form the screw through hole on the module body 41 of the semiconductor module 40. For this reason, the semiconductor module 40 is not easily restricted.

As a result, the semiconductor module 40 and the cooling unit 30 can easily be fixed to the semiconductor device 10. A special fixing member for the semiconductor module 40 and the cooling unit 30, for example, a screw or the like is not required. Therefore, the number of the components can be decreased so that the costs and size can be reduced.

Moreover, the semiconductor device described in Japanese Laid-Open Patent Publication No. 2007-329167 requires the reinforcing beam in order to reinforce the pressing flat spring. In the present embodiment, however, it is possible to cause the reinforcing beam to be unnecessary. Referring to the semiconductor device described in Japanese Laid-Open Patent Publication No. 2007-329167, particularly, it is impossible to expect an advantage of reduction in size of the whole semiconductor device or the like. However, size can be reduced in the semiconductor device 10 according to the present embodiment.

(2) The capacitors 22 are embedded in the terminal board 20. Accordingly, the cooling unit 30 can cool the capacitors 22. In more detail, the cooling unit 30 is provided in close contact with both the semiconductor module 40 and the terminal board 20. Therefore, it is possible to cool the capacitors 22 positioned in the terminal board 20 and the semiconductor module 40.

For example, the heat sink or the radiator plate described in Japanese Laid-Open Patent Publication No. 2007-329167 does not have a structure in which the surface on the opposite side to the surface to which the semiconductor module is fixed by pressing can be utilized effectively in respect of a cooling function. In the present embodiment, however, the lower surface 31b to be the surface on the opposite side to the upper surface 31a to be the surface to which the semiconductor module 40 is fixed by pressing in the cooling unit 30 can be effectively utilized as a radiation surface.

(3) The semiconductor module 40 and the terminal board 20 can be disposed close to each other. Accordingly, electrical wiring is shortened so that wiring inductance can be reduced.

(4) The control circuit board 70 serving as the control board for controlling the semiconductor module 40 is fixed onto the bracket 60. Accordingly, a special member for fixing the control circuit board 70 can be eliminated as unnecessary. In other words, it is not necessary to attach the control circuit board 70 to another member unlike the prior art.

(5) The bracket 60 functions as an electromagnetic noise shielding member for sealing electromagnetic noise between the semiconductor module 40 and the control circuit board 70. Even if electromagnetic noise is generated in the semiconductor module 40, therefore, the bracket 60 functions as an electromagnetic noise shielding member. In other words, the control circuit board 70 is not easily influenced by electromagnetic noise. Moreover, the bracket 60 is used as an electromagnetic noise shielding member. Therefore, it is not necessary to separately provide the dedicated electromagnetic noise shielding member.

(6) The terminal board 20 is formed of plastic. Furthermore, the terminal board 20 has the positive electrode terminal 23, the negative electrode terminal 24 and the base output terminal 25, which serve as the terminal portions to be electrically connected to the terminal of the semiconductor module 40. Therefore, a terminal board 20 having the capacitor is preferred as a practical matter.

FIGS. 8 to 15 illustrate a second embodiment of the present invention. Like the first embodiment, which describes the housing 80, a housing K will be described in detail in the second embodiment.

In the second embodiment, the same structures as those in the first embodiment have the same reference numerals and repetitive description will be omitted or simplified.

Figure 8:
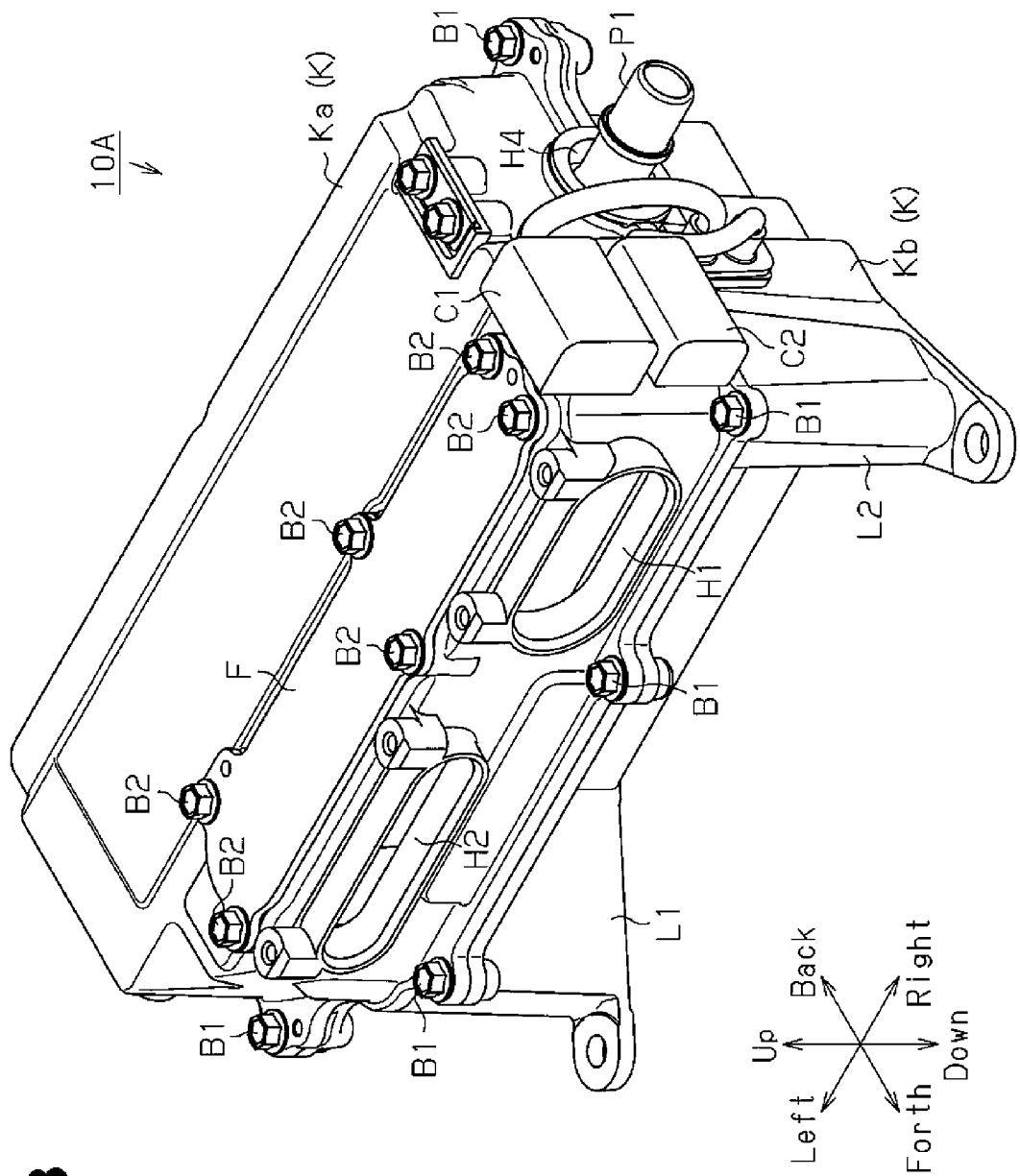
FIG. 8 is a perspective view showing a whole semiconductor device according to a second embodiment.

As shown in FIG. 8, the housing K of a semiconductor device 10A includes an upper housing Ka and a lower housing Kb. Both the upper housing Ka and the lower housing Kb are formed of aluminum. The upper housing Ka and the lower housing Kb are fastened to each other in a plurality of parts (seven parts in the present embodiment) with bolts B1 so that a housing space for accommodating various components of the semiconductor device 10A are formed by a division in the housing K. In the same manner as in the semiconductor device 10 described in the first embodiment, a terminal board 20A (capacitors 22), a cooling unit 30A, semiconductor modules 40A, a flat spring 50A, a bracket 60A and a control circuit board 70A are accommodated in the housing K in a laminating state in sequence from below.

The semiconductor device 10A corresponds to the semiconductor device 10 according to the first embodiment and has the identical function. The terminal board 20A corresponds to the terminal board 20 according to the first embodiment, and furthermore, the cooling unit 30A corresponds to the cooling unit 30 according to the first embodiment. The semiconductor device 10A, the terminal board 20A, and the cooling unit 30A have identical functions as the respective components. The semiconductor modules 40A correspond to the semiconductor modules 40 according to the first embodiment, and furthermore, the flat spring 50A corresponds to the flat spring 50 according to the first embodiment. The semiconductor modules 40A and the flat spring 50A have identical functions as the respective components. The bracket 60A corresponds to the bracket 60 according to the first embodiment, and furthermore, the control circuit board 70A corresponds to the control circuit board 70 according to the first embodiment. The bracket 60A and the control circuit board 70A have identical functions as the respective components.

Figure 10:
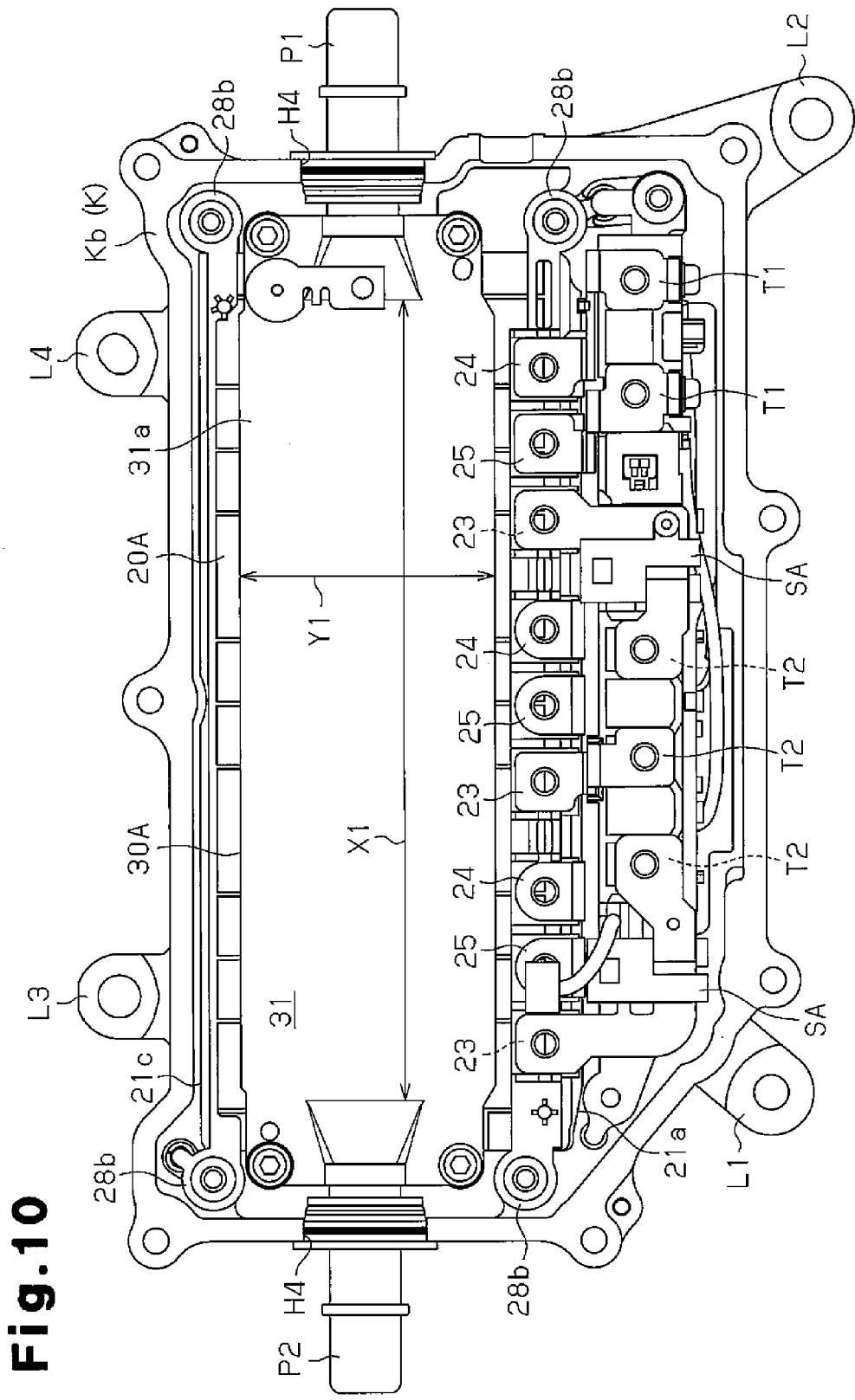
FIG. 10 is a plan view showing a state in which a cooling unit is provided on a terminal board having a capacitor.

As shown in FIG. 8, a power source attaching hole H1 and a power supply attaching hole H2 arranged on left of the power source attaching hole H1 are formed on the upper housing Ka. For convenience, a wall of the upper housing Ka on which the power source attaching hole H1 and the power supply attaching hole H2 are formed will be referred to as a front wall of the upper housing Ka. The housing K has a shape corresponding to a rectangular parallelepiped, and a direction in which the housing K extends will be referred to as a transverse direction. A connector for a power line (not shown) for inputting power from a battery 100 to the semiconductor device 10A is inserted into the power source attaching hole H1. A connector for a motor line (not shown) for outputting a power from the semiconductor device 10 to a traveling motor 110 is inserted into the power supply attaching hole H2. Both of the attaching holes H1 and H2 take an elliptical shape seen from a front and are formed to penetrate the front wall of the upper housing Ka. As shown in FIG. 10, a plurality of, for example, two power terminals T1 corresponding to the power source attaching hole H1 are disposed in the housing K in such a manner that the connector for the power line is connected. Moreover, a plurality of, for example, three motor power supplying terminals T2 corresponding to the power supply attaching hole H2 are disposed in the housing K in such a manner that the connector for the motor line is connected.

Figure 9:
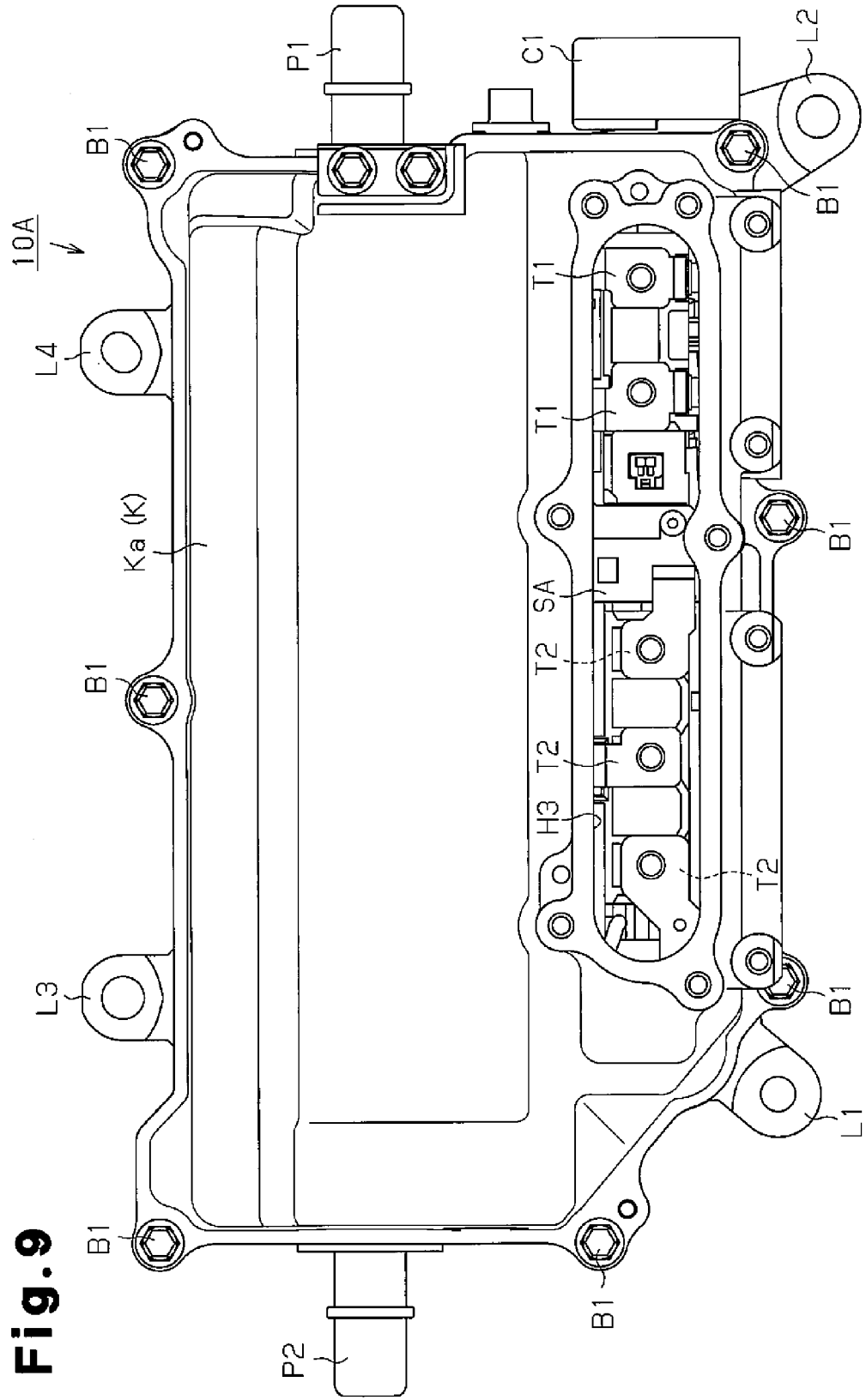
FIG. 9 is a plan view showing a state in which a cover has been removed from an upper housing of the semiconductor device in FIG. 8.

As shown in FIG. 9, a fastening hole H3 having an elliptical shape seen on a plane is formed on an upper wall of the upper housing Ka. As shown in FIG. 8, a cover F for covering the fastening hole H3 is fastened in a plurality of places (six places in the present embodiment) with bolts B2 over the upper wall of the upper housing Ka. One of the fastening holes H3 is formed by a long extension in order to correspond to both the power terminals T1 and the motor power supplying terminals T2, which are arranged in the transverse direction. The work for fastening, to the power terminals T1, the connector for the power line, which is inserted into the power source attaching hole H1, is executed from the outside of the housing K through the fastening hole H3. The work for fastening, to the motor power supplying terminals T2, the connector for the motor line inserted into the power supply attaching hole H2 is also executed from the outside of the housing K through the fastening hole H3.

As shown in FIG. 8, connectors C1 and C2 for a signal line are arranged vertically on the right wall of the upper housing Ka. A signal line for a signal input/output to/from the control circuit board 70A is connected to the connectors C1 and C2 for the signal line.

Attaching legs L1, L2, L3 and L4 for attaching the semiconductor device 10A to a housing of the traveling motor 110 are formed on the lower housing Kb.

As shown in FIG. 9, an inflow pipe P1 serving as an inlet for refrigerant to enter the cooling unit 30A accommodated in the housing K is exposed from the right wall of the housing K and extends to the outside of the housing K. An outflow pipe P2 serving as an outlet for the refrigerant after heat exchange is exposed from the left wall of the housing K and extends to the outside of the housing K. As shown in FIG. 8, the inflow pipe P1 and the outflow pipe P2 are exposed from a boundary part between the upper housing Ka and the lower housing Kb to the outside of the housing K. In other words, a communication hole H4 for placing the inside and outside of the housing K in communication with each other is formed on each of the left and right walls of the housing K.

FIGS. 10 to 14 illustrate a housing structure in which the housing K accommodates various components. The housing structure according to the present embodiment is basically identical to the housing structure according to the first embodiment.

As shown in FIG. 10, the cooling unit 30A is disposed in an upper part of the terminal board 20A provided on a bottom part of the lower housing Kb. The cooling unit 30A has a structure in which the inflow pipe P1 and the outflow pipe P2 are attached to both sides of a cooler body 31 of a flat type which has a rectangular shape from a planar view. As for dimensions of the cooling unit 30A, the length X1 between a base portion of the inflow pipe P1 and that of the outflow pipe P2 is 200 mm to 250 mm. The width Y1 which is orthogonal to the length X1 of the cooling unit 30A is 50 mm to 70 mm. The thickness of the cooler body 31 is 6 mm to 15 mm. A fin member, which is not shown, is disposed in the cooling unit 30A, and a refrigerant passage is formed by the fin member.

The board fixing screws S1 for fixing the terminal board 20A to the lower housing Kb is hidden by the cooling unit 30A in FIG. 10.

As shown in FIG. 10, the terminal board 20A has a mounting surface serving as a mounting portion for mounting the cooling unit 30A. The terminal board 20A is formed like a plate having a rectangular shape seen on a plane. The length of the terminal board 20A is almost equal to the length X1 of the cooling unit 30A. The width of the terminal board 20A is greater than the width Y1 of the cooling unit 30A. The thickness of the terminal board 20A varies depending on the output of the capacitors 22. More specifically, in the case in which the output is 50 Kw, the thickness of the terminal board 20A is approximately 30 mm. In the case in which the output is 80 Kw, the thickness of the terminal board 20A is approximately 60 mm. In the semiconductor device 10A according to the present embodiment, the dimension of the terminal board 20A and that of the capacitors 22 are regulated by a thickness depending on the output. In assembly of the semiconductor device 10A, the lower housing Kb is prepared to have a height depending on the output of the capacitors 22 to be accommodated in the housing K. The upper housing Ka is combined with the lower housing Kb. Bracket attaching portions 28b serving as a fixing portion for fixing the bracket 60A to the terminal board 20A is formed in four corners of the terminal board 20A.

Figure 11:
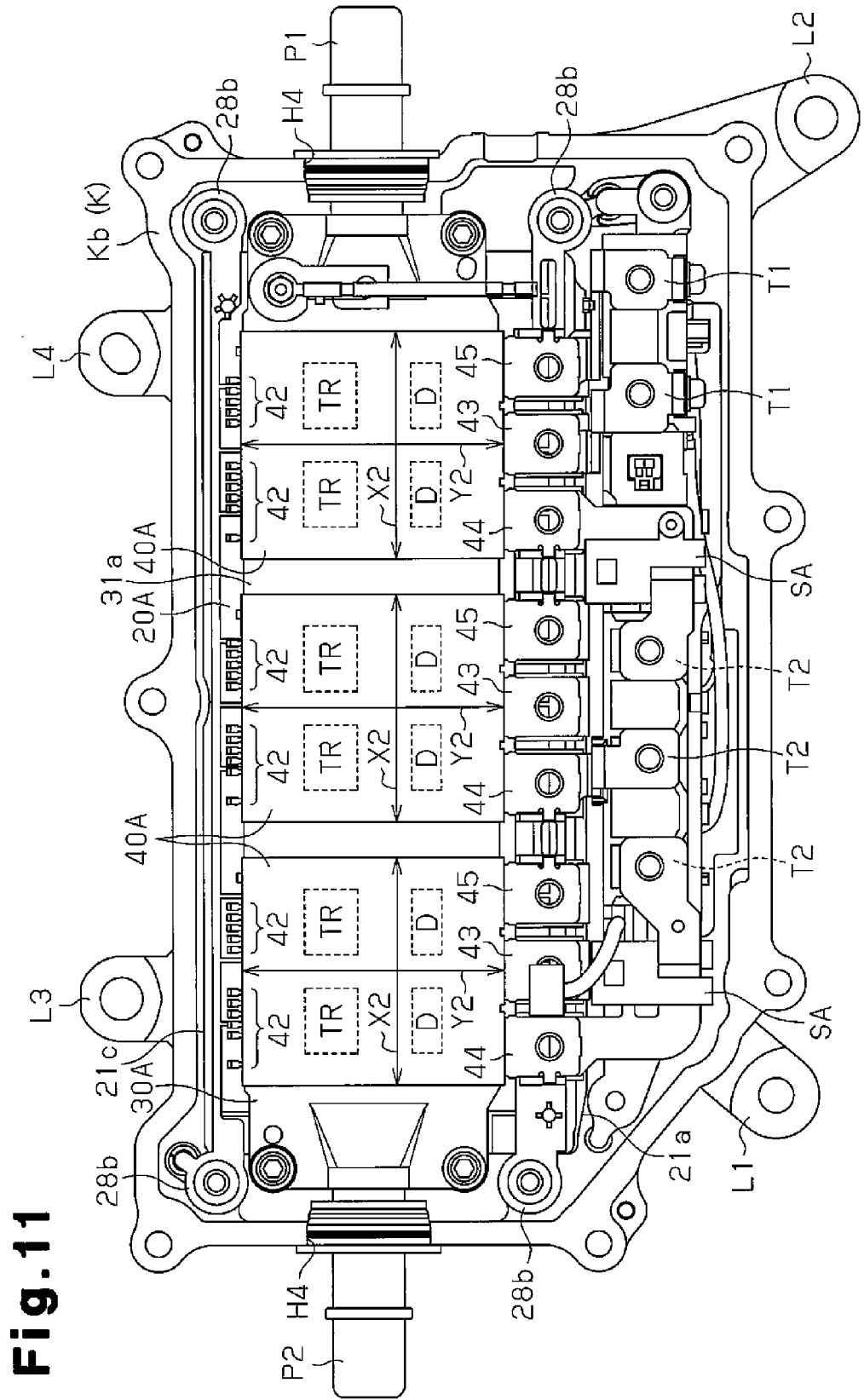
FIG. 11 is a plan view showing a state in which a semiconductor module is provided on the cooling unit in FIG. 10.
Figure 12:
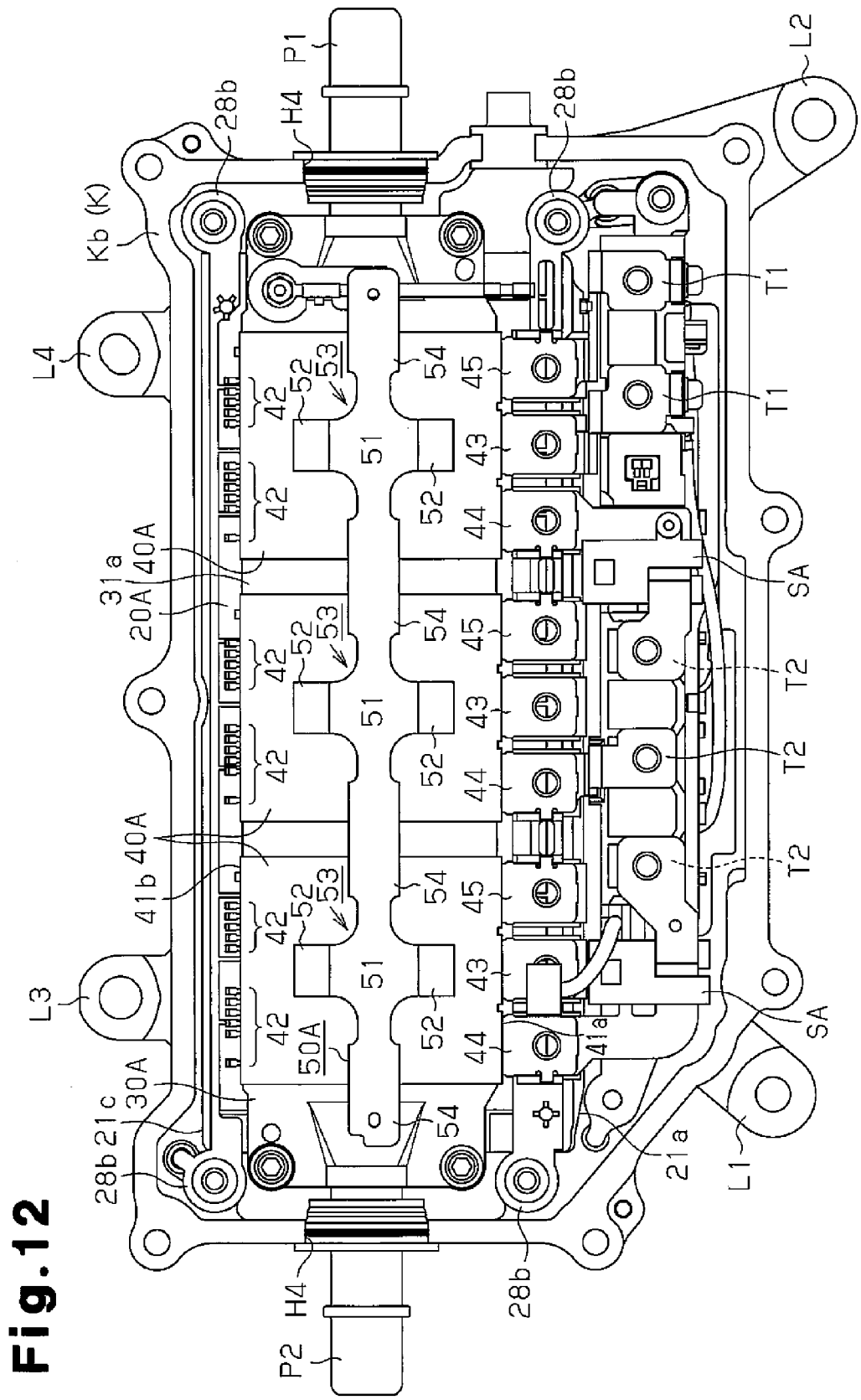
FIG. 12 is a plan view showing a state in which a flat spring is provided on the semiconductor module in FIG. 11.

A plurality of sets (three sets in the present embodiment) of terminal groups including the positive electrode terminals 23, the negative electrode terminals 24 and the base output terminals 25 as a set are provided on a first long side surface 21a serving as a single side edge of the terminal board 20A in a longitudinal direction of the terminal board 20A. The power terminals T1 and the motor power supplying terminals T2 are provided in the lower housing Kb along the side edge of the terminal board 20A, in which the terminal groups are disposed. Two sets of current sensors SA are provided in the lower housing Kb. In FIGS. 10 to 12, the positive electrode terminals 23 of the terminal group on a left end and the positive electrode terminals 23 of the terminal group on a right end in the drawing overlap with the terminal of the current sensors SA. Two power terminals T1 are provided as shown in FIGS. 9 to 14. On the other hand, three motor power supplying terminals T2 are provided. In FIGS. 9 to 14, the motor power supplying terminal T2 in the center is shown, and the left and right motor power supplying terminals T2 each overlap with the terminal of the current sensors SA.

As shown in FIG. 11, a plurality of (three in the present embodiment) semiconductor modules 40A are disposed in an upper part of the cooling unit 30A in a direction along the length X1 of the cooling unit 30A. Each of the semiconductor modules 40A is mounted on the cooling unit 30A through silicone grease, which is not shown. The length X2 of each semiconductor module 40A is 40 mm to 60 mm. The width Y2, which is orthogonal to the length X2, in the semiconductor module 40A is 50 mm to 70 mm. The dimension of the cooling unit 30A having a mounting surface for mounting the semiconductor modules 40A is set depending on the dimension and number of the semiconductor modules 40A to be mounted. In other words, the dimension of the cooling unit 30A is set based on the dimension of a region (a mounting region) in the planar mounting of all of the semiconductor modules 40A in the upper part of the cooling unit 30A. The dimensions of the cooling unit 30A are defined by the length X1 and the width Y1. The dimensions of the cooling unit 30 are equivalent to the dimensions of the upper surface 31a of the cooling unit 30A serving as a cooling opposed surface facing the semiconductor modules 40A to be mounted.

In each semiconductor module 40A, two sets of transistors (IGBTs) TR and two sets of diodes D are sealed with resin. The transistor TR is an element having a square shape seen on a plane and having a width of approximately 15 mm, and furthermore, the diode D is an element having a size that is almost half the size of the transistor TR.

Figure 13:
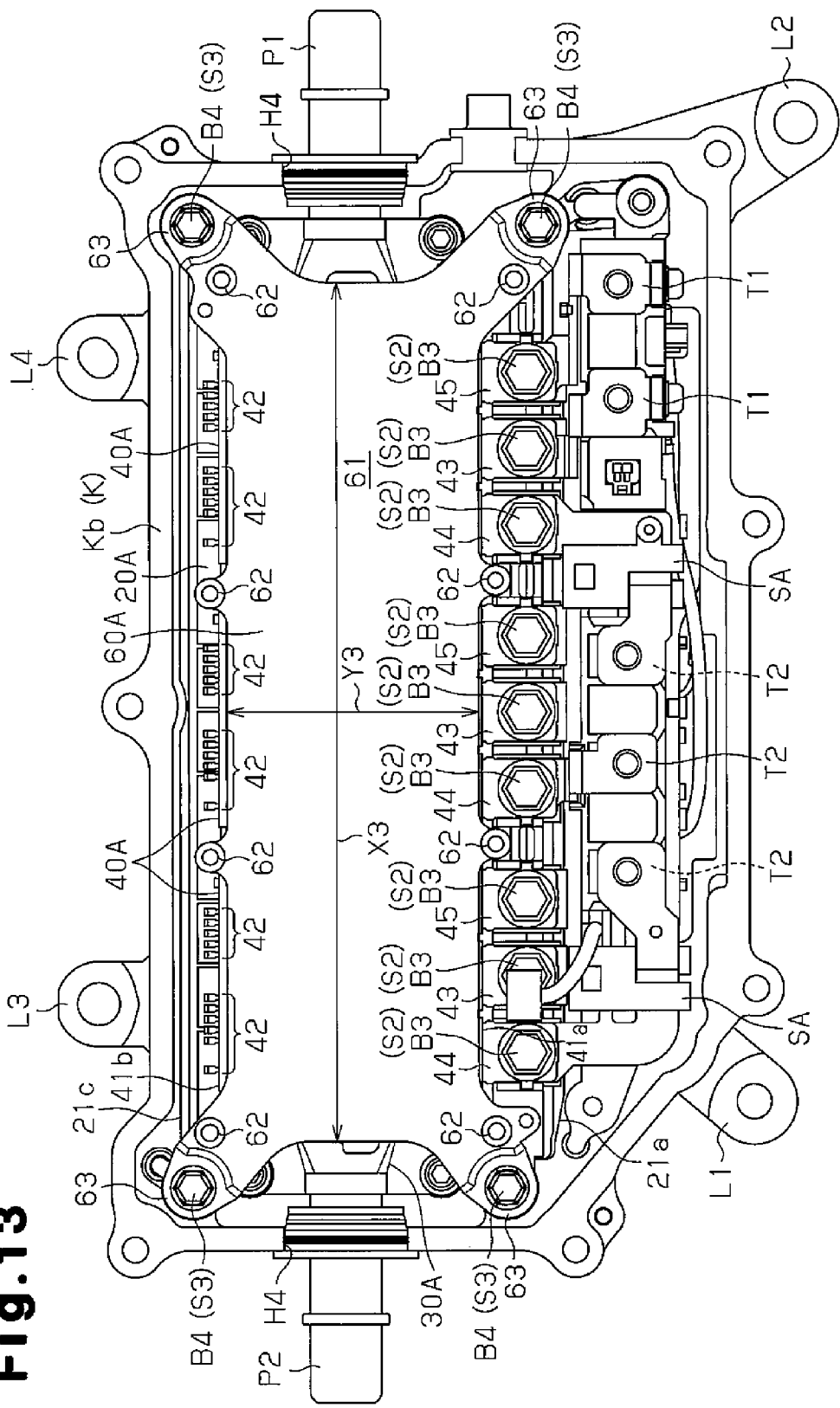
FIG. 13 is a plan view showing a state in which a bracket is provided on the flat spring in FIG. 12.

Each semiconductor module 40A includes a power line terminal 44 to be connected to the positive electrode terminal 23 of the terminal board 20A, a ground line terminal 45 to be connected to the negative electrode terminal 24, and a module output terminal 43 to be connected to the base output terminal 25. Each semiconductor module 40A is disposed for one terminal group of the terminal board 20A. The respective terminals 43 to 45 of each semiconductor module 40A are fastened and fixed to the terminal group of the terminal board 20A that corresponds thereto with bolts B3 serving as terminal connecting screws S2, and are thus connected electrically. FIG. 13 shows a state in which the bolts B3 fasten and fix the terminals 23 to 25 to the terminals 43 to 45. In other words, in the present embodiment, the terminals 43 to 45 are fastened and fixed to the terminals 23 to 25 with the bolts B3 after the fixation of the bracket 60A.

As shown in FIG. 11, each semiconductor module 40A includes a control signal terminal 42. The control signal terminal 42 is disposed on a second surface 41b, which is an end of the semiconductor module 40A provided with the power line terminal 44, the grounding line terminal 45 and the module output terminal 43, that is, an end on an opposite side to the first surface 41a. In the present embodiment, consequently, a terminal on the power line side is collectively disposed into one of sides of the semiconductor device 10A, while the terminal 42 on the control signal line side is collectively disposed into the other opposite side of the semiconductor device 10A. The terminals on the power line side include the terminal group of the terminal board 20A, the terminals 43 to 45 of the semiconductor modules 40A, the power terminals T1, and the motor power supplying terminals T2.

As shown in FIG. 12, the flat spring 50A is disposed on the semiconductor modules 40A. The flat spring 50A is formed by a spring steel plate. The flat spring 50A according to the present embodiment has a plurality of (for example, three) pressing portions 53, and two horizontal coupling portions 54 for coupling the pressing portions 53 to each other. Each of the pressing portions 53 has a horizontal spring center portion 51 and two spring bent portions 52, which are configured through bending from the spring center portion 51 obliquely and downward. The pressing portions 53 are provided at a predetermined interval from each other in order to apply a pressing force to the vicinity of the central part of the semiconductor module 40A when the flat spring 50A is disposed on the semiconductor module 40A.

As shown in FIG. 13, the bracket 60A is disposed on the flat spring 50A. The bracket 60A is formed by a metallic plate material such as aluminum. The bracket 60A has a bracket body 61 formed like a plate having a rectangular shape seen on a plane, and attaching portions 63 protruded obliquely and outward is formed in four corners of the bracket body 61. The attaching portions 63 of the bracket 60A are fastened and fixed to the bracket attaching portions 28b of the terminal board 20A with bolts B4 serving as the bracket fixing screws S3. The bracket attaching portion 28b is shown in FIGS. 10 to 12. A plurality of (for example, eight in total) protruding board attaching columns 62 are formed on a pair of long sides of the bracket 60A. The board attaching columns 62 positioned in four corners of the bracket 60A are formed in the attaching portions 63 extended from the four corners of the bracket 60A in order to attach the bracket 60A to the terminal board 20A.

Figure 15:
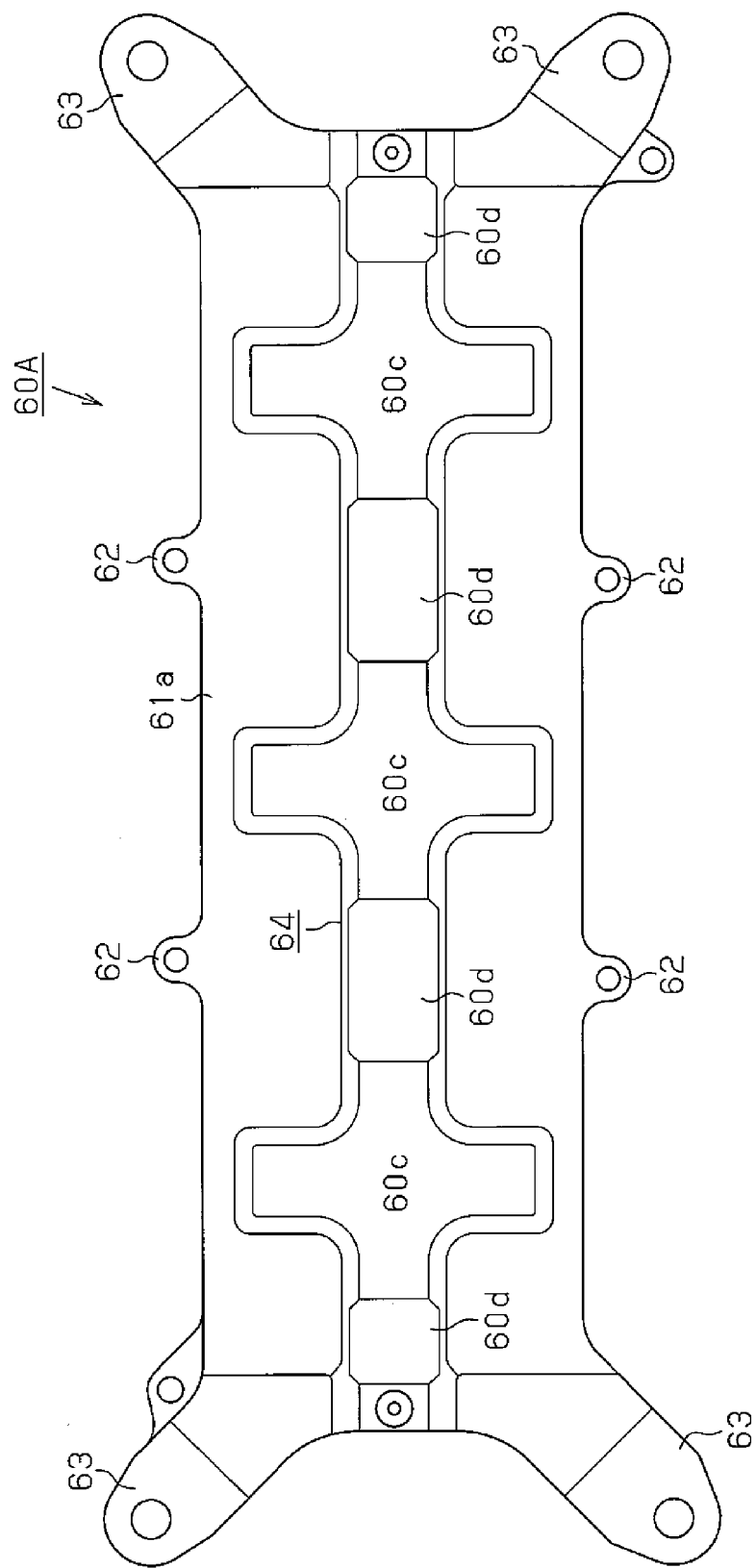
FIG. 15 is a bottom view showing a back surface, that is, a lower surface of the bracket in FIG. 13.

As shown in FIG. 15, a holding portion 64 for holding the flat spring 50A is formed on a back surface of the bracket 60A, that is, a lower surface 61a. The holding portion 64 has a plurality of (three in the present embodiment) recesses 60c capable of accommodating the pressing portion 53, and a horizontal contact portions 60d, which are provided in surface contact with the coupling portions 54 of the flat spring 50. In a state in which the flat spring 50 is disposed on the semiconductor modules 40A, the recesses 60c are each formed in a position corresponding to one of the pressing portions 53. The contact portions 60d are each formed in a position corresponding to one of the coupling portions 54 of the flat spring 50. The contact portions 60d are formed to have a shallower recessed shape than a depth of the recesses 60c.

Thus, the holding portion 64 formed on the lower surface 61a of the bracket 60A holds the flat spring 50A, which is mounted on the semiconductor modules 40A. The bracket 60A is fastened and fixed to the terminal board 20A with bracket fixing screws S3 so that the flat spring 50A is pressed from above and is thus deformed. Accordingly, the semiconductor modules 40A and the cooling unit 30A are pressed downward and fixed by a downward urging force generated by the flat spring 50A. Each of the pressing portions 53 of the flat spring 50A is held in one of the recesses 60c of the bracket 60A. Also in the case in which the bracket 60A is fastened and fixed to the terminal board 20A, therefore, the flat spring 50A presses the semiconductor modules 40A toward the terminal board 20A by a proper urging force.

Figure 14:
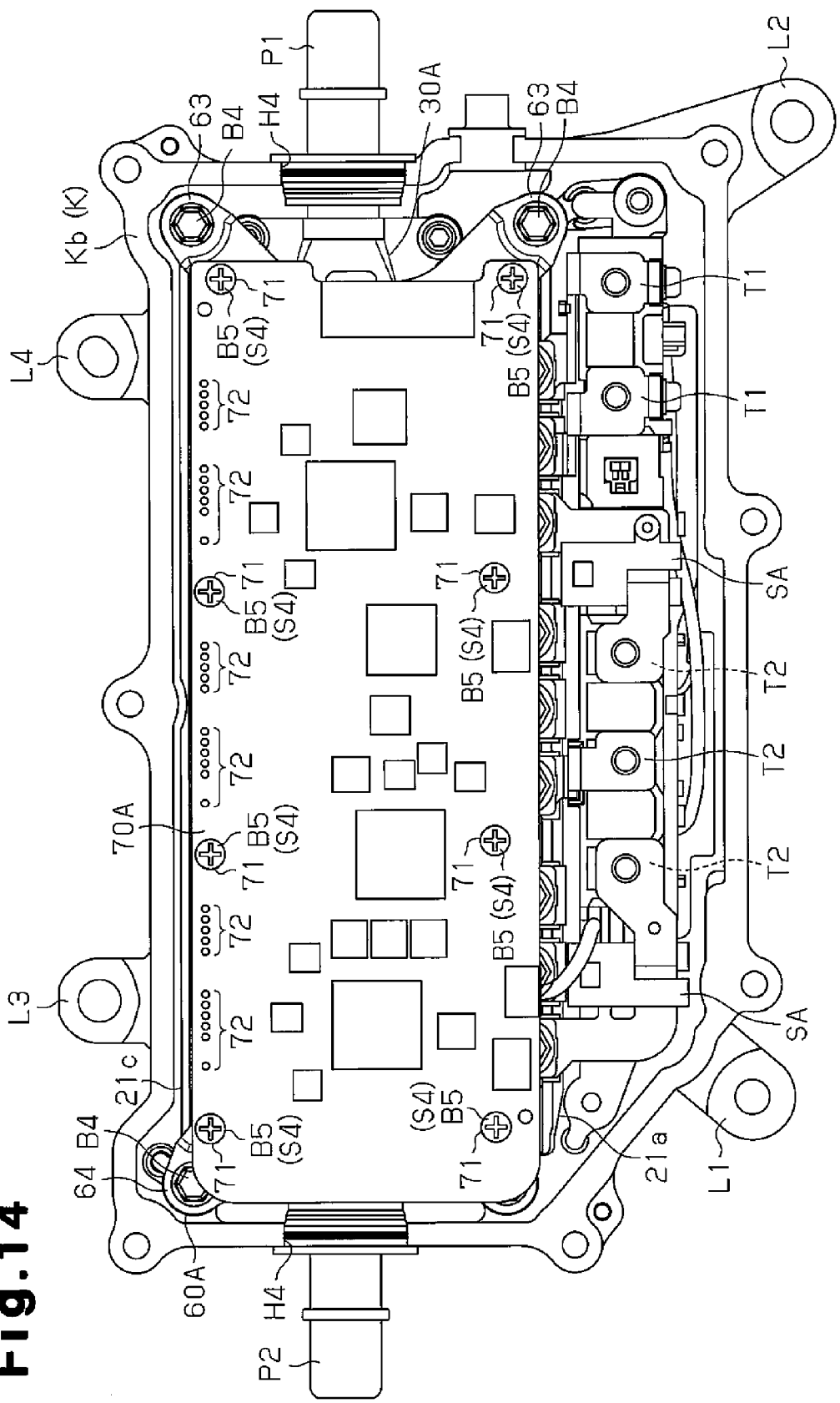
FIG. 14 is a plan view showing a state in which a control circuit board is provided on the bracket in FIG. 13, with an upper housing removed.

As shown in FIG. 14, the control circuit board 70A is disposed on the bracket 60A. The control circuit board 70A is formed like a plate having a rectangular shape seen from a planar view. A plurality of (in the present embodiment, eight in total) screwing portions 71 are formed corresponding to the board attaching columns 62 of the bracket 60A on a pair of long sides of the control circuit board 70A. The screwing portions 71 of the control circuit board 70A are fastened and fixed to the board attaching columns 62 of the bracket 60A with screws B5 serving as board fixing screws S4.

The bracket 60A applies a pressing force to each of the semiconductor modules 40A through the flat spring 50A. Accordingly, the dimension of the bracket 60A is set depending on the dimension and number of the semiconductor modules 40A in the same manner as in the cooling unit 30A. By setting the dimension of the control circuit board 70A corresponding to the dimension of the bracket 60A, therefore, the bracket 60A can have the board attaching columns 62 as attaching portions for attaching the control circuit board 70A to the bracket 60A. In other words, it is not necessary to provide attaching portions for supporting the control circuit board 70 in the lower housing Kb or the terminal board 20A. Consequently, it is possible to contribute to reduction in the size of the semiconductor device 10A. The dimension of the bracket 60A is defined by a length X3 and a width Y3 shown in FIG. 13. The dimension of the bracket 60A is the dimension of the lower surface 61a of the bracket 60A, which serves as a support opposed surface to the semiconductor modules 40A when the bracket 60A is mounted on the semiconductor modules 40A.

As shown in FIG. 14, a plurality of signal terminal attaching portions 72 for attaching the control signal terminals 42 of the semiconductor modules 40A are formed on one of the long sides of the control circuit board 70A. The signal terminal attaching portions 72 are collectively disposed on an opposite side to the terminal at the power line side in the same manner as the control signal terminals 42 of the semiconductor modules 40A.

The semiconductor device 10A according to the present embodiment is assembled using the same assembling procedure as the semiconductor device 10 according to the first embodiment. In other words, assembly is carried out by laminating the terminal board 20A, the cooling unit 30A, the semiconductor modules 40A, the flat spring 50A, the bracket 60A and the control circuit board 70A in this order. By the urging function of the flat spring 50A and the bracket 60A, the cooling unit 30A and the semiconductor modules 40A are fixed to the terminal board 20A. In the semiconductor device 10A according to the present embodiment, the semiconductor modules 40A are cooled by the action of the cooling unit 30A.

According to the present embodiment, therefore, the following advantage can also be produced in addition to the same advantages (1) to (5) as those in the first embodiment.

(6) The dimension of the component such as the cooling unit 30A or the bracket 60A is set based on the dimension of the mounting region in which the housing K mounts the semiconductor module 40 thereon. Accordingly, it is possible to implement reduction in the size of the whole semiconductor device 10A without generating wasteful space in the housing K.

(7) The cooling unit 30A of a flat type having a small thickness is used. Accordingly, the distance between the capacitors 22 and the semiconductor modules 40A can be shortened, and a design having small wiring inductance can be realized. In other words, it is possible to form a circuit structure having small loss.

(8) The main components, for example, the terminal board 20A, the cooling unit 30A, the semiconductor modules 40A, the flat spring 50A, the bracket 60A and the control circuit board 70A are laminated and disposed in the housing K. For this reason, in manufacturing, it is sufficient that these components are stacked in sequence. This facilitates assembly. Furthermore, it is possible to reduce manufacturing costs.

(9) The terminals 43 to 45 on the power line side and the terminals 42 on the control signal line side are collectively disposed on the opposite side to each other in the semiconductor device 10A. In other words, these terminals are collectively positioned in a state in which these terminals are opposed to each other. Therefore, it is possible to simplify the configuration of wire routing. In other words, it is possible to reduce the size of the whole semiconductor device 10A without generating wasteful space in the housing K.

(10) The cooling unit 30A is a separate component from the housing K. Accordingly, it is possible to enhance the degree of freedom for layout in the housing K. As a result, it is possible to reduce the size of the semiconductor device 10A.

(11) The semiconductor modules 40A are planarly disposed on the cooling unit 30A. Therefore, it is possible to reduce the height of the semiconductor device 10A. As a result, it is possible to reduce the size of the semiconductor device 10A.

The embodiment is not restricted to the foregoing but may be modified in the following manner.

The material, shape or the like of the components according to the embodiment is properly changed depending on the specification (uses) of the semiconductor device.

The whole structure of the semiconductor device according to the embodiment is properly changed depending on the specification (uses) of the semiconductor device.

The terminal boards 20 and 20A according to the embodiment include the capacitors 22. However, it is also possible to use a terminal board which does not include the capacitor. In other words, although the terminal boards 20 and 20A having the capacitors 22 and the terminal board integrated are used in the above embodiment, it is not necessary to integrate them depending on the applications (uses) for the semiconductor device.

It is sufficient that the brackets 60 and 60A can press the flat springs 50 and 50A, and furthermore, the control circuit boards 70 and 70A can be fixed to the brackets 60 and 60A. In addition, it is sufficient that the brackets 60 and 60A are formed of a metal and the brackets 60 and 60A can thus shield electromagnetic noise between the semiconductor modules 40 and 40A and the control circuit boards 70 and 70A.

Although the brackets 60 and 60A are formed of metal (aluminum) in the above embodiment, they may be formed of plastic. In the case in which the electromagnetic noise shielding effect is to be obtained, at least a part of the brackets 60 and 60A is required to be formed of a metal.

The brackets 60 and 60A may be fixed to the housings 80 and K or cooling units 30 and 30A in addition to the terminal board (the terminal board 20). It is possible to make modifications depending on the specification (uses) of the semiconductor device. In the case in which the brackets 60 and 60A are fixed to the cooling units 30 and 30A, an attaching boss serving as an attaching member is provided on the cooling units 30 and 30A. It is sufficient that the brackets 60 and 60A are disposed on the attaching boss and are thus fixed with a screw or the like.

Figure 18:
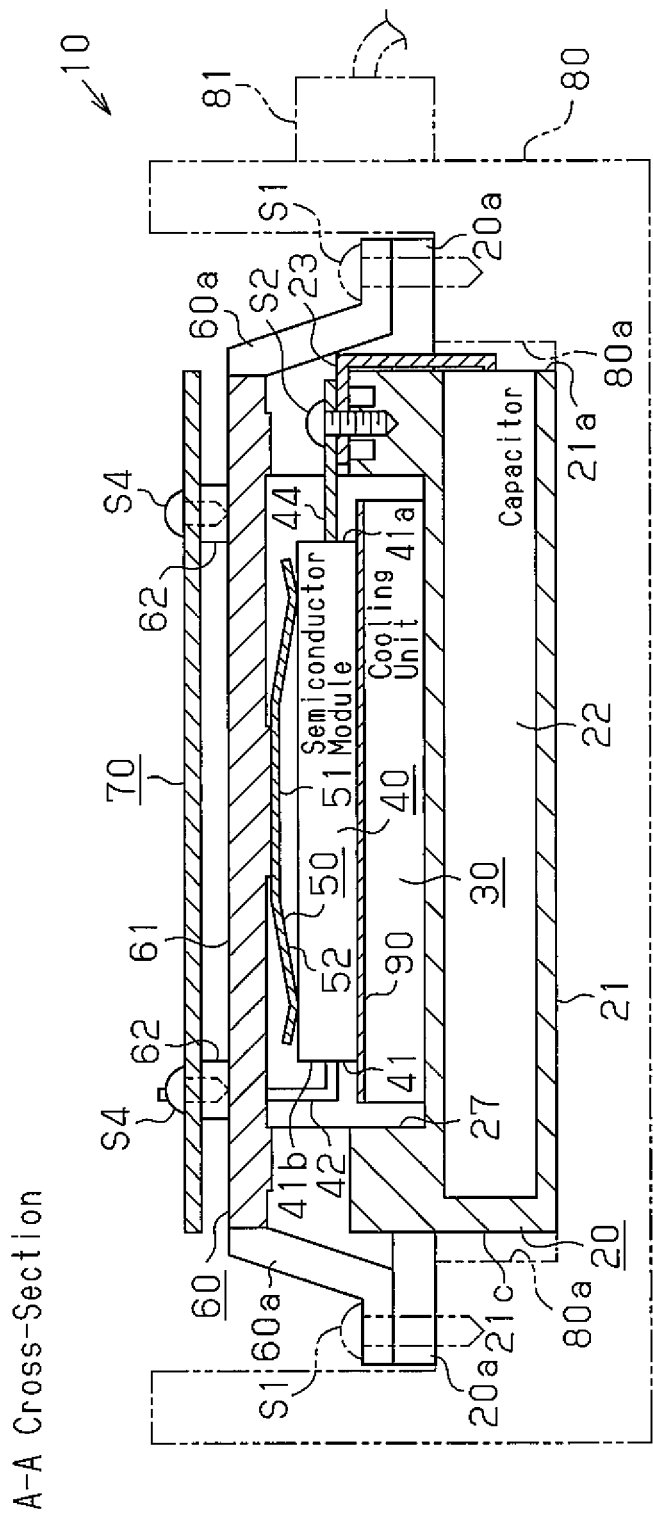
FIG. 18 is a cross-sectional view showing a semiconductor device according to a further modification, corresponding to the cross-sectional view along line A-A in FIG. 1.

FIG. 18 shows a modification in which the bracket 60 is fixed to the housing 80. The board fixing screws S1 fix both the bracket 60 and the terminal board 20 to the housing 80. The bracket 60 has a plurality of bracket legs 60a extended obliquely and downward, and the bracket legs 60a overlap with the attaching arms 20a of the terminal board 20. The board fixing screws S1 penetrate the bracket legs 60a and the attaching arms 20a of the terminal board 20 and are thus fastened and fixed to the terminal board attaching portions 80a of the housing 80. In other words, the terminal board 20, the bracket 60 and the housing 80 are collectively fastened with the board fixing screws S1. In the terminal board 20 of FIG. 18, the bracket attaching portions 28 can be deleted from the terminal board 20 shown in FIG. 2, and furthermore, the bracket fixing screws S3 for fastening and fixing the bracket 60 to the terminal board 20 can be deleted.

The structure shown in FIG. 18 can also be applied to the semiconductor device 10A according to the second embodiment. For example, both the bracket 60A and the terminal board 20A are fastened and fixed to the lower housing Kb in the housing K with the bolts B4 serving as the bracket fixing screws S3. The attaching portions 63 extended from the bracket 60A and the bracket attaching portions 28b extended from the terminal board 20A are positioned on the lower housing Kb. The attaching portions 63 and the bracket attaching portions 28b, which are overlaid vertically, are fastened and fixed to the lower housing Kb with the bolts B4 serving as the bracket fixing screws S3. Also in this case, the terminal board 20A, the bracket 60A and the housing K are collectively fastened with the bolts B4. In this case, the board fixing screws S1 can be deleted.

In each of the first embodiment, the second embodiment, and the modification shown in FIG. 18, the terminal boards 20 and 20A have fixing portions for fixing the brackets 60 and 60A. In other words, the terminal boards 20 and 20A according to the first and second embodiments have the bracket attaching portions 28 and 28b serving as the fixing portions for fixing the brackets 60 and 60A. Also in the terminal boards 20 and 20A according to the modification, the bracket attaching portions 28 and 28b serve as the fixing portions for fixing the brackets 60 and 60A.

Although the flat springs 50 and 50A are used as the spring members in the above embodiments, it is also possible to use a spring having another shape, for example, a disc spring. In other words, it is possible to make modifications depending on the applications (uses) for the semiconductor device.

Although the cooling units 30 and 30A of the water cooling type are used in the above embodiments, it is also possible to use a heat sink or a radiator plate (block) of an air cooling type or the like. In other words, it is possible to make modifications depending on the specification (uses) of the semiconductor device.

Although silicone grease 90 is used between the semiconductor modules 40 and 40A and the cooling units 30 and 30A in the above embodiments, it is also possible to use another heat conducting member such as a radiating sheet. In other words, it is possible to make modifications depending on the applications (uses) for the semiconductor device.

Although nothing is provided between the cooling units 30 and 30A and the terminal boards 20 and 20A in the above embodiments, it is possible to provide a heat conducting member such as silicone grease or a heat radiating sheet if necessary.

Figure 16:
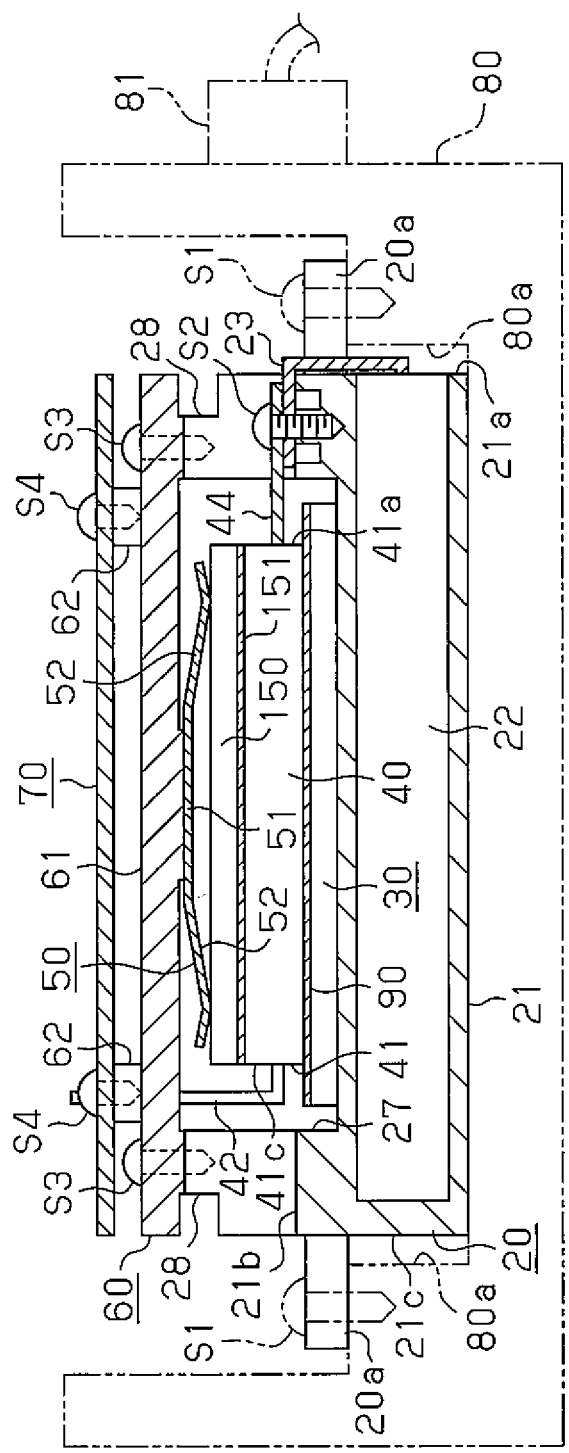
FIG. 16 is a longitudinal cross-sectional view showing a semiconductor device according to a modification.

As shown in FIG. 16, a cooling unit 150 may be disposed between the semiconductor module 40 and the flat spring 50. The cooling unit 150 is an upper cooling unit provided on the semiconductor module 40. Silicone grease 151 is provided between the cooling unit 150 and the semiconductor module 40. In other words, a single cooling unit is additionally provided to interpose the semiconductor module 40 by a pair of cooling units from above and below. In the state in which both of the upper and lower surfaces of the semiconductor module 40 are interposed between the cooling units 30 and 150, thus, the flat spring 50 presses the cooling units 30 and 150 and the semiconductor module 40 toward the terminal board 20. In this case, heat can also be radiated from the upper side of the semiconductor module 40. Therefore, a heat radiating property can be enhanced.

It is also possible to remove the cooling unit 30 and to provide only the cooling unit 150.

Figure 17A:
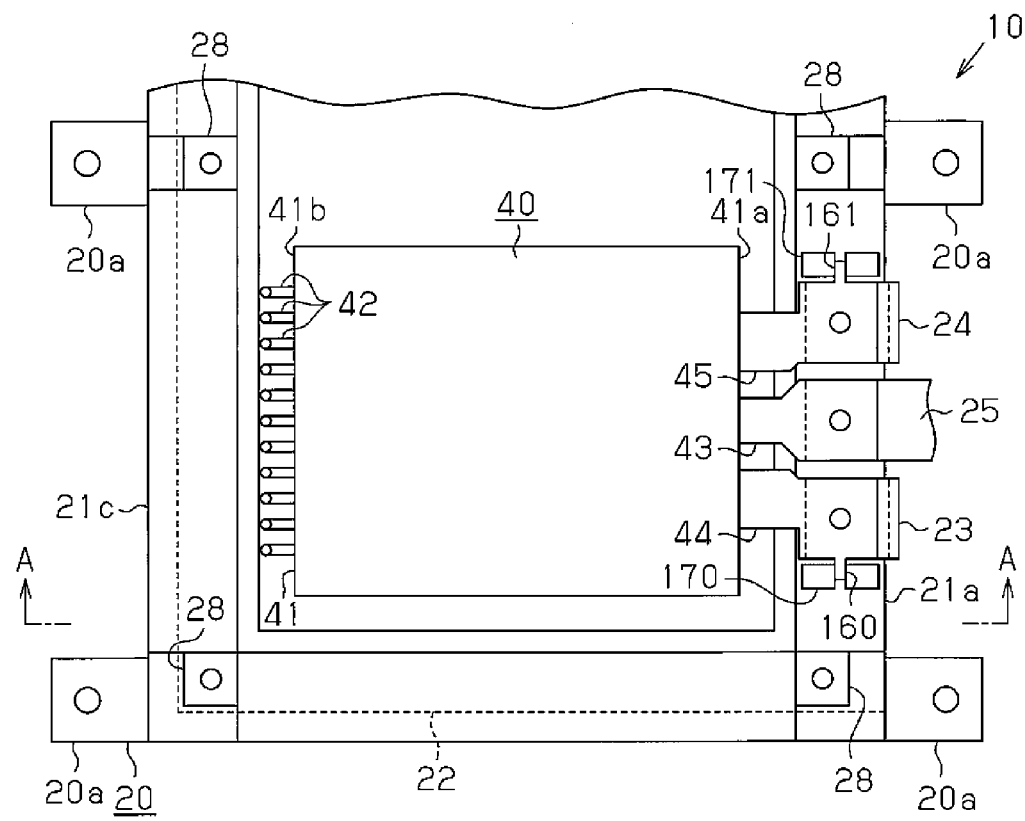
FIG. 17(a) is an explanatory plan view for illustrating the component configuration in a semiconductor device according to another modification.
Figure 17B:
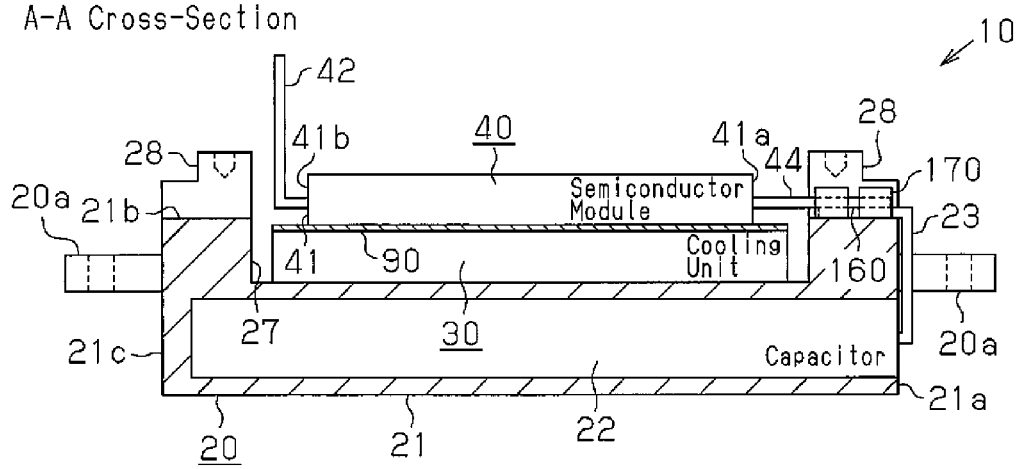
FIG. 17(b) is a longitudinal cross-sectional view taken along line A-A in FIG. 17(a)

As shown in FIG. 17, a bar-shaped projection 160 may be formed on an outer side surface of the plate-shaped power line terminal 44 to be the electrical connecting terminal of the semiconductor module 40. A recessed member 170 having such a shape as to be fitted in the projection 160 is provided on the upper surface 21b of the insulating base 21, that is, the terminal mounting surface. The recessed member 170 is a pair of protrusions has a tip forked. Similarly, a bar-shaped projection 161 is formed on an outer side surface of the grounding line terminal 45, and a recessed member 171 having such a shape as to be fitted in the projection 161 is provided on the upper surface 21b of the insulating base 21, that is, the terminal mounting surface.

By fitting the projections 160 and 161 of the semiconductor module 40 in the recessed members 170 and 171 of the terminal board 20, it is possible to position the semiconductor module 40. The terminals, for example, the power line terminal 44 and the grounding line terminal 45 are positioned. Therefore, it is possible to reduce a positional shift of a terminal fastening portion before carrying out the fastening with the terminal connecting screws S2. Accordingly, the assembly is facilitated. The function for preventing the rotation of the semiconductor module 40 can be obtained in addition to the positioning function. In other words, it is possible to position the semiconductor module 40, and furthermore, to prevent the rotation.

It is sufficient that the processing for providing the projections 160 and 161 on the power line terminal 44 and the grounding line terminal 45 is executed simultaneously with a work for processing the external shapes of the power line terminal 44 and the grounding line terminal 45. Accordingly, it is not necessary to add the processing, and it is also possible to prevent an increase in cost.

In FIG. 17, thus, the terminals 44 and 45 of the semiconductor module 40 are positioned on the terminal board 20 through projection-recess engagement. As a result, the terminals 44 and 45 of the semiconductor module 40 can easily be positioned on the terminal board 20 through projection-recess engagement.

Although the projections 160 and 161 are formed on the single semiconductor module 40 in FIG. 17, the projections 160 and 161 may be formed on another semiconductor module in the same manner. Places in which the projections 160 and 161 are to be formed are not restricted to the respective outer side surfaces of the power line terminal 44 and the grounding line terminal 45. The positions and numbers of the projections 160 and 161 may be properly changed. It is not necessary to always have the structure in which the bar-shaped projections 160 and 161 having the protruding shape are provided on the power line terminal 44 and the grounding line terminal 45 in the semiconductor module 40, and the recessed members 170 and 171 having the recessed shape are provided on the terminal board 20, and they may be provided reversely. In other words, it is also possible to employ a structure in which the bar-shaped projection having the protruding shape is formed on the terminal board 20 and the recessed member having the recessed shape is provided on the power line terminal 44 and the grounding line terminal 45 in the semiconductor module 40.

Although the brackets 60 and 60A have the function of the electromagnetic noise shielding member in the above embodiments, the brackets 60 and 60A do not necessary always have the function of the electromagnetic noise shielding members.

Although the semiconductor device is applied to a traveling motor driving device for a hybrid vehicle in the above embodiments, the present invention is not restricted thereto but may be applied to a traveling motor driving device (an inverter) for an electric car (an EV car), for example.

The order for arranging the module output terminal 43, the power line terminal 44 and the grounding line terminal 45, which are extended from the semiconductor modules 40 and 40A in FIG. 6 and the like can freely be changed to some degree. In order to reduce inductance, it is desirable that the power line terminal 44 and the grounding line terminal 45 should be disposed adjacent to each other.

What is claimed:

1. A semiconductor device comprising:
   a semiconductor module having a module terminal;
   a cooling unit configured to cool the semiconductor module;
   a terminal board configured to be electrically connected to the module terminal, the semiconductor module and the cooling unit being laminated on the terminal board;
   a spring member disposed on the semiconductor module and the cooling unit, the spring member being configured to press the semiconductor module and the cooling unit against the terminal board in a stacked direction of the semiconductor module and the cooling unit; and
   a spring support tool disposed on the spring member in order to support the spring member, the spring support tool applying, to the spring member, an urging force for pressing the semiconductor module and the cooling unit against the terminal board, wherein:

the terminal board includes a mounting surface and a first fixing portion protruding from the mounting surface of the terminal board along the stacked direction of the semiconductor module of the cooling unit, the module terminal extending from the semiconductor module in a direction perpendicular to the stacked direction, the semiconductor module further comprises a screw fixing the module terminal to the first fixing portion by being inserted into the first fixing portion along the stacked direction, the cooling unit is disposed on the mounting surface of the terminal board, and the semiconductor module is disposed on the cooling unit.

2. The semiconductor device according to claim 1, further comprising a control board configured to control the semiconductor module, and a control signal terminal connected to the control board, the control signal terminal extending from the semiconductor module in a direction opposite to the urging force, wherein the control board is fixed directly onto the spring support tool and the spring support tool is configured to function as an electromagnetic noise shielding member positioned between the semiconductor module and the control board.

3. The semiconductor device according to claim 1, wherein the semiconductor device further comprises a capacitor embedded in the terminal board, and a terminal of the capacitor is extended along the long side surface of a base of the terminal board in an upward direction, and thereafter extended to the first fixing portion in a horizontal direction with L-shaped form.

4. The semiconductor device according to claim 1, wherein the cooling unit is a lower cooling unit provided under the semiconductor module, the semiconductor device further comprising an upper cooling unit provided on the semiconductor module.

5. The semiconductor device according to claim 1, wherein the module terminal is configured to be positioned on the terminal board through fitting based on a projection-recess relationship.

6. The semiconductor device according to claim 1, wherein the terminal board is formed of plastic, and the terminal board has a terminal portion to be electrically connected to the module terminal.

7. The semiconductor device according to claim 1, wherein the module terminal has a plurality of power terminals, the semiconductor module further includes a plurality of control signal terminals, and of a first side and a second side, which interpose the semiconductor module therebetween, the power terminals are collectively disposed on the first side, and the control signal terminals are collectively disposed on the second side.

8. The semiconductor device according to claim 1, wherein
the cooling unit has a cooling opposed surface, with the cooling opposed surface facing the semiconductor module,
the spring support tool has a support opposed surface, with the support opposed surface facing the semiconductor module,
the semiconductor module includes a first surface opposing to the cooling opposed surface and a second surface,
the cooling opposed surface of the cooling unit includes a mounting region for mounting the semiconductor module on the terminal board,
the first surface of the semiconductor module defines a size of the mounting region, and
the dimension of the cooling opposed surface and the dimension of the support opposed surface are set based on the dimension of the mounting region.

9. The semiconductor device according to claim 1, wherein the terminal board has a mounting portion for mounting the cooling unit on the mounting portion, and the terminal board further has a second fixing portion configured in part to fix the spring support tool.

* * * * *